United States Patent
Senoo

(10) Patent No.: US 9,589,952 B2
(45) Date of Patent: Mar. 7, 2017

(54) REVERSE CONDUCTING IGBT

(71) Applicant: TOYOTA JIDOSHA KABUSHIKI KAISHA, Toyota-shi, Aichi-ken (JP)

(72) Inventor: Masaru Senoo, Okazaki (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 15/095,458

(22) Filed: Apr. 11, 2016

(65) Prior Publication Data

US 2016/0351561 A1    Dec. 1, 2016

(30) Foreign Application Priority Data

May 27, 2015  (JP) ................................ 2015-107314

(51) Int. Cl.

| H01L 27/00 | (2006.01) |
|---|---|
| H01L 29/00 | (2006.01) |
| H01L 27/06 | (2006.01) |
| H01L 29/872 | (2006.01) |
| H01L 29/739 | (2006.01) |
| H01L 29/06 | (2006.01) |

(52) U.S. Cl.
CPC ...... *H01L 27/0635* (2013.01); *H01L 29/0684* (2013.01); *H01L 29/0696* (2013.01); *H01L 29/7397* (2013.01); *H01L 29/872* (2013.01)

(58) Field of Classification Search
CPC ............... H01L 29/872; H01L 29/0696; H01L 29/0684; H01L 29/7397; H01L 27/0635; H01L 27/0629; H01L 27/0664
See application file for complete search history.

(56) References Cited

U.S. PATENT DOCUMENTS

| 7,759,732 B2* | 7/2010 | Saito ................... H01L 29/0634 257/335 |
|---|---|---|
| 2002/0030237 A1* | 3/2002 | Omura ................ H01L 29/0634 257/397 |
| 2007/0272977 A1* | 11/2007 | Saito ................... H01L 29/0634 257/329 |
| 2008/0012050 A1 | 1/2008 | Aoki et al. |
| 2012/0326207 A1* | 12/2012 | Yoshimochi ........ H01L 29/7397 257/139 |
| 2014/0015007 A1 | 1/2014 | Werber et al. |
| 2014/0048847 A1 | 2/2014 | Yamashita et al. |
| 2014/0084335 A1 | 3/2014 | Senoo et al. |
| 2015/0035006 A1 | 2/2015 | Yoshimochi |

FOREIGN PATENT DOCUMENTS

| JP | 2008-021930 A | 1/2008 |
|---|---|---|
| JP | 2010-010583 A | 1/2010 |
| JP | 2013-048230 A | 3/2013 |

* cited by examiner

*Primary Examiner* — Nikolay Yushin
(74) *Attorney, Agent, or Firm* — Andrews Kurth Kenyon LLP

(57) ABSTRACT

A reverse conducting IGBT is provided with a trench gate member that is provided in an IGBT region and has a lattice-pattern layout, and a trench member that is provided in a diode region and has a stripe-pattern layout. The diode region of the semiconductor substrate includes an anode region of a first conductive type, a drift region of a second conductive type and a barrier region of the second conductive type. The barrier region is electrically connected to a top surface electrode via a pillar member that extends from a top surface of the semiconductor substrate.

9 Claims, 17 Drawing Sheets

REVERSE CONDUCTING IGBT

CROSS-REFERENCE TO RELATED APPLICATION

This application claims priority to Japanese Patent Application No. 2015407314 filed on May 27, 2015, the contents of which are hereby incorporated by reference into the present application.

TECHNICAL FIELD

The technique disclosed in the present application relates to a reverse conducting IGBT (Insulated Gate Bipolar Transistor).

DESCRIPTION OF RELATED ART

For example, reverse conducting IGBTs have been under development for use as on-vehicle power devices. A reverse conducting IGBT includes a semiconductor substrate partitioned into an IGBT region in which an IGBT structure is provided and a diode region in which a diode structure is provided. The diode structure is connected in antiparallel to the IGBT structure, and. functions as a free-wheeling diode.

Japanese Patent Application Publication No. 2013-48230 (FIGS. 16 to 17 and 47 to 50 in particular) discloses a reverse conducting IGBT having an n-type barrier region provided in a diode region of a semiconductor substrate. The n-type barrier region is provided between a type anode anode region and an n-type drift region, and has an impurity concentration which is higher than an impurity concentration of the drift region. The barrier region is electrically connected to an emitter electrode (which serves as an anode electrode in the diode structure) via a pillar member that extends from a top surface of the semiconductor substrate. This causes a potential of the barrier region to be maintained at a potential which is close to a potential of the emitter electrode, thus keeping down a voltage that is applied in a forward direction of a p-n junction constituted by the anode region and the bather region. This reduces a number of holes injected from the anode region into the drift region, thus improving reverse recovery characteristics of the diode structure.

In this type of reverse conducting IGBT, a trench gate member is often provided in the IGBT region. Furthermore, in this type of reverse conducting IGBT, a trench member is often provided in the diode region in order to relax an electric field in the diode region. Examples of the "trench member" described herein include a type of trench member that is electrically insulated from the trench gate member, and a type of trench member that is electrically connected to the trench gate member. Further, examples of the type of "trench member" that is electrically insulated from the trench gate member include a type of trench member that is electrically connected to an emitter electrode, and a type of trench member that has a floating potential. As disclosed in Japanese Patent Application Publication No. 2013-48230, the trench gate member in the IGBT region and the trench member in the diode region are configured, in consideration of symmetry, to have common layouts.

The inventors of the present invention studied and found that when the trench gate member in the IGBT region is configured to have a lattice-pattern layout, there is an increase in carrier concentration of the IGBT region, and thus there is a reduction in power loss in the IGBT structure.

For this reason, it is desirable that the trench gate member in the IGBT region has a lattice-pattern layout.

It has become obvious that if, in this case, the trench member in the diode region is configured, in consideration of symmetry, to also have a lattice-pattern layout, the following problems arise. When the trench member in the diode region has a lattice-pattern layout, the lattice-patterned trench member causes the barrier region provided in the diode region to be divided into a plurality of parts. As noted above, the barrier region needs to be electrically connected to the emitter electrode via the pillar member. For this reason, in order to enable the barrier region to fulfill a function of suppressing hole injection, each of the parts into which the barrier region has been divided must be electrically connected to the emitter electrode via a pillar member. However, if there is a malformation in a pillar member that corresponds to any of the parts into which the barrier region has been divided, there is a faulty electrical connection between that pillar member and the emitter electrode. This disables that part of the barrier region which corresponds to the pillar region, thus giving rise to deterioration in the reverse recovery characteristics of the diode structure.

BRIEF SUMMARY

The present specification provides a technology for achieving both reduction in power loss in an IGBT structure and improvement in the reverse recovery characteristics of a diode structure in a reverse conducting IGBT having a barrier region provided in a diode region.

One aspect of a reverse conducting IGBT disclosed in the application comprises a semiconductor substrate, a bottom surface electrode, a top surface electrode, a trench gate member and a trench member. The semiconductor substrate is partitioned into an IGBT region in which an IGBT structure is provided and a diode region in which a diode structure is provided. The bottom surface electrode is in contact with a bottom surface of the semiconductor substrate, and is in contact with both the IGBT region and the diode region of the semiconductor substrate. The top surface electrode is in contact with a top surface of the semiconductor substrate, and is in contact with both the IGBT region and the diode region of the semiconductor substrate. The trench gate member is provided in the IGBT region of the semiconductor substrate, and has a lattice-pattern layout when seen from a direction orthogonal to the top surface of the semiconductor substrate. The trench member is provided in the diode region of the semiconductor substrate, and has a stripe-pattern layout when seen from the direction orthogonal to the top surface of the semiconductor substrate. The trench member comprises a plurality of stripe trenches extending along a first direction. The diode region of the semiconductor substrate comprises an anode region of a first conductive type, a drift region of a second conductive type and a barrier region of the second conductive type. The anode region is provided between adjacent stripe trenches, is exposed at the top surface of the semiconductor substrate, and is in contact with the top surface electrode. The drift region is provided beneath the anode region. The bather region is provided between adjacent stripe trenches, is provided between the anode region and. the drift region, and has an impurity concentration which is higher than an impurity concentration of the drift region. The barrier region is electrically connected to the top surface electrode via a pillar member that extends from the top surface of the semiconductor substrate.

In the reverse conducting IGBT according to the abovementioned aspect, the trench gate member in the IGBT region has the lattice-pattern layout, and the trench member in the diode region has the stripe-pattern layout. Since the trench gate member in the IGBT region has the lattice-pattern layout, there is an increase in carrier concentration of the IGBT region, and thus there is a reduction in power loss in the IGBT structure. Meanwhile, the trench member in the diode region includes the plurality of stripe trenches extending along the first direction. For this reason, the bather region provided in the diode region is not divided by the trench member in the first direction and can thus spread over a wide area along the first direction. Therefore, as long as some part of the bather region extending over a wide area in the first direction can be surely electrically connected to the top surface electrode via the pillar member, the whole of the barrier region is electrically connected to the top surface electrode. This enables the barrier region to reduce the number of holes injected from the anode region into the drift region and thus improve reverse recovery characteristics of the diode structure. Thus, the reverse conducting IGBT according to the aspect, in which the trench gate member in the IGBT region and the trench member in the diode region have different layout, can achieve both a reduction in power loss in the IGBT region and improvement in the reverse recovery characteristics of the diode structure.

DETAILED DESCRIPTION OF INVENTION

Figure 1:
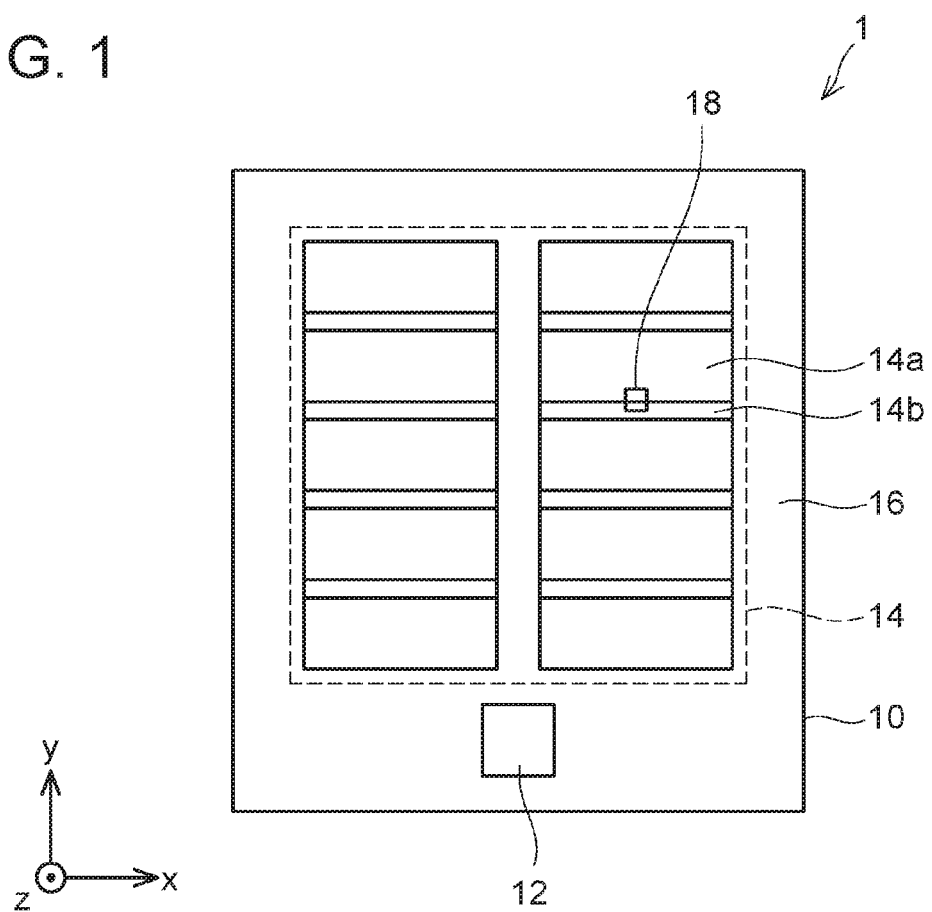
FIG. 1 schematically shows an overall layout of a reverse conducting IGBT.

As shown in FIG. 1, a reverse conducting IGBT 1 includes a semiconductor substrate 10 partitioned into an element portion 14 and a terminal portion 16. In one example, the semiconductor substrate 10 is an n⁻-type Si single-crystal. substrate having a specific resistance of 40 to 100 Ωcm and a thickness of 80 to 165 μm. The element portion 14, which is partitioned on a center side of the semiconductor substrate 10, is a portion in which a current flows in a thickness direction (z-axis direction), and is provided with IGBT and diode structures to be described later. The terminal portion 16, which is partitioned on a peripheral side of the semiconductor substrate 10, is a portion that relaxes an electric field on the peripheral side of the semiconductor substrate 10, and is provided with a withstand-voltage structure such as a guard ring. Further provided on the terminal portion 16 of the semiconductor substrate 10 is a gate pad 12. Connected to this gate pad 12 is a gate wire (not illustrated) routed on the terminal portion 16 of the semiconductor substrate 10.

The element portion 14 of the semiconductor substrate 10 is further partitioned into IGBT regions 14*a* in each of which an IGBT structure is provided and diode regions 14*b* in each of which a diode structure is provided. The IGBT regions 14*a* and the diode regions 14*b* each has a rectangular shape has a longitudinal side in an x-axis direction. Further, the IGBT regions 14*a* and the diode regions 14*b* are alternately arranged in a repeated pattern in a y-axis direction. It is desirable that a length of the IGBT regions 14*a* in the y-axis direction be set to be greater than a thickness of the semiconductor substrate 10. In one example, in a case where the thickness of the semiconductor substrate 10 is approximately 120 μm, the length of the IGBT regions 14*a* in the y-axis direction is approximately 700 μm. It is desirable that a length of the diode regions 14*b* in the y-axis direction he set to be greater than the thickness of the semiconductor substrate 10. In one example, in a case where the thickness of the semiconductor substrate 10 is approximately 120 μm, the length of the diode regions 14*b* in the y-axis direction is approximately 300 μm. In FIG. 1, a reference sign 18 refers to boundary ranges 18 between the IGBT regions 14*a* and the diode regions 14*b*. The reverse conducting IGBT 1 according to the present embodiment is described below with reference to the boundary ranges 18, which serves as a clear manifestation of features of the reverse conducting IGBT 1 according to the present embodiment.

Figure 2:
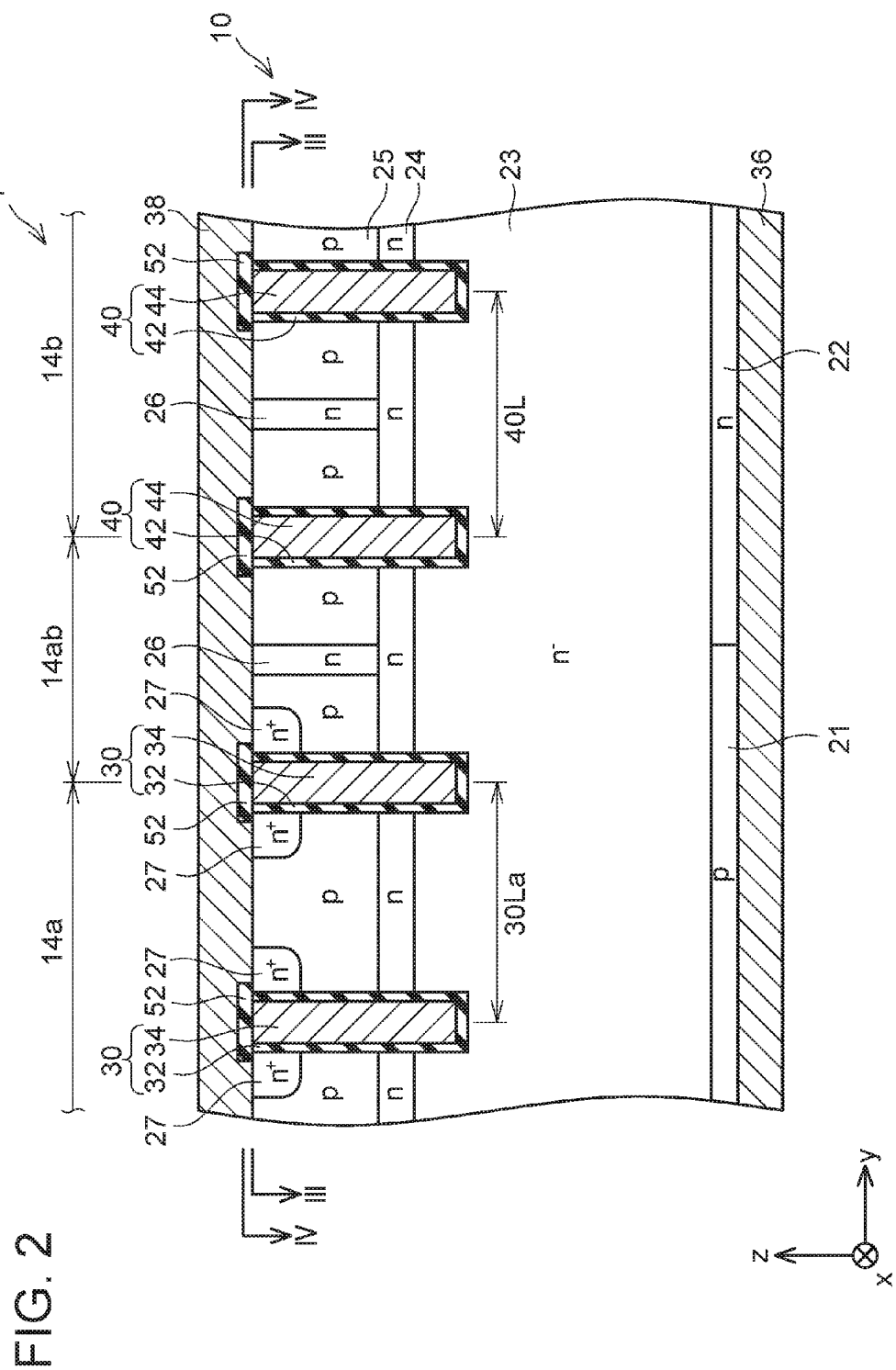
FIG. 2 is a cross-sectional view schematically showing main components in a boundary range between an IGBT region and a diode region of the reverse conducting IGBT (i.e. a cross-sectional view taken along the line II-II in FIG. 3)

As shown in FIG. 2, the reverse conducting IGBT 1 includes the semiconductor substrate 10, a collector electrode 36 covering a bottom surface of the semiconductor substrate 10, and an emitter electrode 38 covering a top surface of the semiconductor substrate 10. The collector electrode 36 is a laminated electrode of AlSi (or Al)Ti/Ni/Au or Ti/Ni/Au having a thickness of 1 to 30 μm. The emitter electrode 38 is a single-layer electrode of Al or AlSi or a laminated electrode of AlSi (or AD/Ti/Ni/Au having a thickness of 3 to 30 μm. The semiconductor substrate 10 is partitioned into the IGBT regions 14a in each of which the IGBT structure is provided, the diode regions 14b in each of which the diode structure is provided, and boundary regions 14ab located between the IGBT regions 14a and the diode regions 14b. The reverse conducting IGBT 1 further includes trench gate members 30 provided in each IGBT region 14a, dummy trench members 40 provided in each diode region 14b, and an interlayer insulation film 52 provided on the top surface of the semiconductor substrate 10.

The semiconductor substrate 10 includes p-type collector regions 21, n-type cathode regions 22, an n⁻-type drift region 23, an n-type barrier region 24, a p-type body region 25, n-type pillar regions 26, and n⁺-type emitter regions 27.

Each collector region 21 is disposed in the IGBT region 14a and a part of the boundary region 14ab. The collector region 21 is provided in a part of a lower layer portion of the semiconductor substrate 10 and exposed at the bottom surface of the semiconductor substrate 10. The collector region 21 has a high impurity concentration, and is in ohmic contact with the collector electrode 36. The collector region 21 is provided, for example, by introducing boron through the bottom surface of the semiconductor substrate 10 by utilizing an ion implantation technique. In one example, the collector region 21 has a peak impurity concentration of $1\times10^{15}$ to $1\times10^{19}$ cm$^{-3}$ and a thickness of 0.2 to 3 μm.

Each cathode region 22 is disposed in the diode region 14b and a part of the boundary region 14ab. The cathode region 22 is provided in a part of the lower layer portion of the semiconductor substrate 10 and exposed at the bottom surface of the semiconductor substrate 10. The cathode region 22 has a high impurity concentration, and is in ohmic contact with the collector electrode 36. The cathode region 22 is provided, for example, by introducing phosphorus through the bottom surface of the semiconductor substrate 10 by utilizing the ion implantation technique. In one example, the cathode region 22 has a peak impurity concentration of $1\times10^{18}$ to $1\times10^{21}$ cm$^{-3}$ and a thickness of 0.2 to 3 μm.

The drift region 23 is disposed in the IGBT regions 14a, the diode regions 14b, and the boundary regions 14ab. The drift region 23 is provided between the collector region 21 and the barrier region 24 in the IGBT region 14a and a part of the boundary region 14ab. The drift region 23 is provided between the cathode region 22 and the barrier region 24 in the diode region 14b and a part of the boundary region 14ab. The drift region 23 is a part of the semiconductor substrate 10 that remained after other regions have been formed, and has an impurity concentration which is uniform in the thickness direction.

The barrier region 24 is disposed in the IGBT regions 14a, the diode regions 14b, and the boundary regions 14ab. The barrier region 24 is provided between the drift region 23 and the body region 25. The barrier region 24 disposed in each IGBT region 14a is provided between adjacent trench gate members 30, and has a form that areally spreads to be in contact with side surfaces of both of the adjacent trench gate members 30. The barrier region 24 disposed in each IGBT region 14a has a floating potential. A barrier region 24 disposed in the diode region 14b is provided between adjacent dummy trench members 40, and has a form that areally spreads to be in contact with side surfaces of both of the adjacent dummy trench members 40. The barrier region 24 disposed in the diode region 14b is electrically connected to the emitter electrode 38 via the pillar region 26. The barrier region 24 disposed in the boundary region 14ab is provided between a trench gate member 30 and a dummy trench member 40, and has a form that areally spreads to be in contact with side surfaces of both the trench gate member 30 and the dummy trench member 40. The barrier region 24 disposed in the boundary region 14ab is electrically connected to the emitter electrode 38 via the pillar region 26. The barrier region 24 is formed, for example, by introducing phosphorus through the top surface of the semiconductor substrate 10 by utilizing the ion implantation technique. In one example, the barrier region 24 has a peak impurity concentration of $1\times10^{15}$ to $1\times10^{18}$ and a thickness of 0.2 to 3 μm.

The body region 25 is disposed in the IGBT regions 14a, the diode regions 14b, and the boundary regions 14ab. The body region 25 is provided in a top layer portion of the semiconductor substrate 10 and exposed at the top surface of the semiconductor substrate 10. The body region 25 has a high impurity concentration, and is in ohmic contact with the emitter electrode 38. The body region 25 may include a high-impurity-concentration contact region as needed in a portion thereof that is in contact with the emitter electrode 38. The body region 25 disposed in the IGBT region 14a is provided between adjacent trench gate members 30, and is in contact with side surfaces of both of the adjacent trench gate members 30. The body region 25 disposed in the diode region 14b is provided between adjacent dummy trench members 40, and is in contact with side surfaces of both of the adjacent dummy trench members 40. The body region 25 disposed in the diode region 14b is also referred to as "anode region". The body region 25 disposed in the boundary region 14ab is provided between a trench gate member 30 and a dummy trench member 40, and is in contact with side surfaces of both the trench gate member 30 and the dummy trench member 40. The body region 25 is formed, for example, by introducing boron through the top surface of the semiconductor substrate 10 by utilizing the ion implantation technique. In one example, the body region 25 has a peak impurity concentration of $1\times10^{16}$ to $1\times10^{19}$ cm$^{-3}$ and a thickness of 0.2 to 5 μm.

The pillar regions 26 are disposed in the diode regions 14b and the boundary regions 14ab, Each pillar region 26 is provided to penetrate the body region 25 from the top surface of the semiconductor substrate 10 and reach the barrier region 24, and electrically connects the emitter electrode 38 and the barrier region 24 to each other. The pillar region 26 has its impurity concentration adjusted so that the pillar region 26 is in Schottky contact with the emitter electrode 38. A pillar region 26 disposed in the diode region 14b is provided between adjacent dummy trench members 40 and separated from both of the adjacent dummy trench members 40 by the body region 25. A pillar region 26 disposed in the boundary region 14ab is provided between a trench gate member 30 and a dummy trench member 40 and separated from both the trench gate member 30 and the dummy trench member 40 by the body region 25. The pillar regions 26 are formed, for example, by introducing phosphorus through the top surface of the semiconductor substrate 10 by utilizing the ion implantation technique. In one example, the pillar regions 26 have a peak impurity concentration of $8\times10^{13}$ to $1\times10^{18}$ cm$^{-3}$.

The emitter regions 27 are disposed in the IGBT regions 14a and the boundary regions 14ab. Each emitter region 27 is provided in the top layer portion of the semiconductor substrate 10 and exposed at the top surface of the semiconductor substrate 10. The emitter region 27 has a high impurity concentration, and is in ohmic contact with the emitter electrode 38. The emitter region 27 is formed, for example, by introducing arsenic or phosphorus through the top surface of the semiconductor substrate 10 by utilizing the ion implantation technique, In one example, the emitter region 27 has a peak impurity concentration of $1\times10^{18}$ to $1\times10^{21}$ cm$^{-3}$ and a thickness of 0.2 to 1.5 µm.

The trench gate members 30 extend in a depth direction in the IGBT regions 14a to penetrate the emitter regions 27, the body region 25, and the barrier region 24 and reach the drift region 23. The emitter regions 27, the body region 25, and the bather region 24 are in contact with the side surfaces of the trench gate member 30. The drift region 23 is in contact with the side and bottom surfaces of the trench gate member 30. Each trench gate member 30 includes a trench gate insulation film 32 and a trench gate electrode 34. The trench gate electrode 34 is insulated from the semiconductor substrate 10 by the trench gate insulation film 32. In one example, the trench gate member 30 has a depth of 3 to 7 µm.

The dummy trench members 40 extend in the depth direction to penetrate the body region 25 and the barrier region 24 and reach the drift region 23. The body region 25 and the barrier region 24 are in contact with the side surfaces of each dummy trench member 40. The drift region 23 is in contact with the side and bottom surfaces of each dummy trench member 40. Each dummy trench member 40 includes a dummy trench insulation film 42 and a dummy trench electrode 44. The dummy trench electrode 44 is insulated from the semiconductor substrate 10 by the dummy trench insulation film 42. In one example, the dummy trench member 40 has a depth of 3 to 7 µm.

Figure 3:
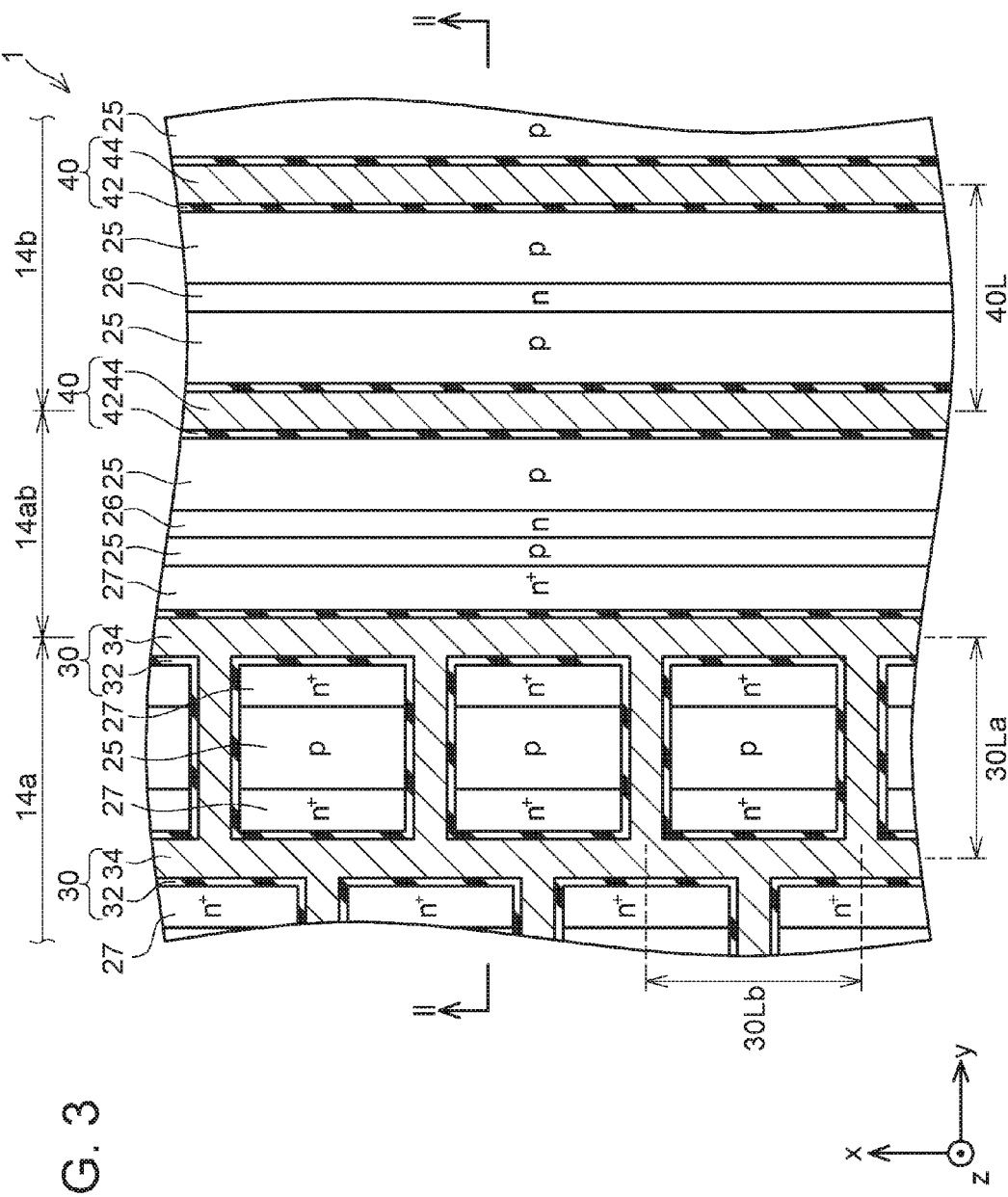
FIG. 3 is a top view schematically showing a semiconductor substrate of the reverse conducting IGBT (i.e. a cross-sectional view taken along the line III-III in FIG. 2)

As shown in FIG. 3, the reverse conducting IGBT 1. is configured such that the trench gate members 30 and the dummy trench members 40 have different layouts. The trench gate member 30 provided in the IGBT region 14a is configured to have a lattice-pattern layout. The dummy trench member 40 provided in the diode region 14b is configured to have a stripe-pattern layout.

Figure 5:
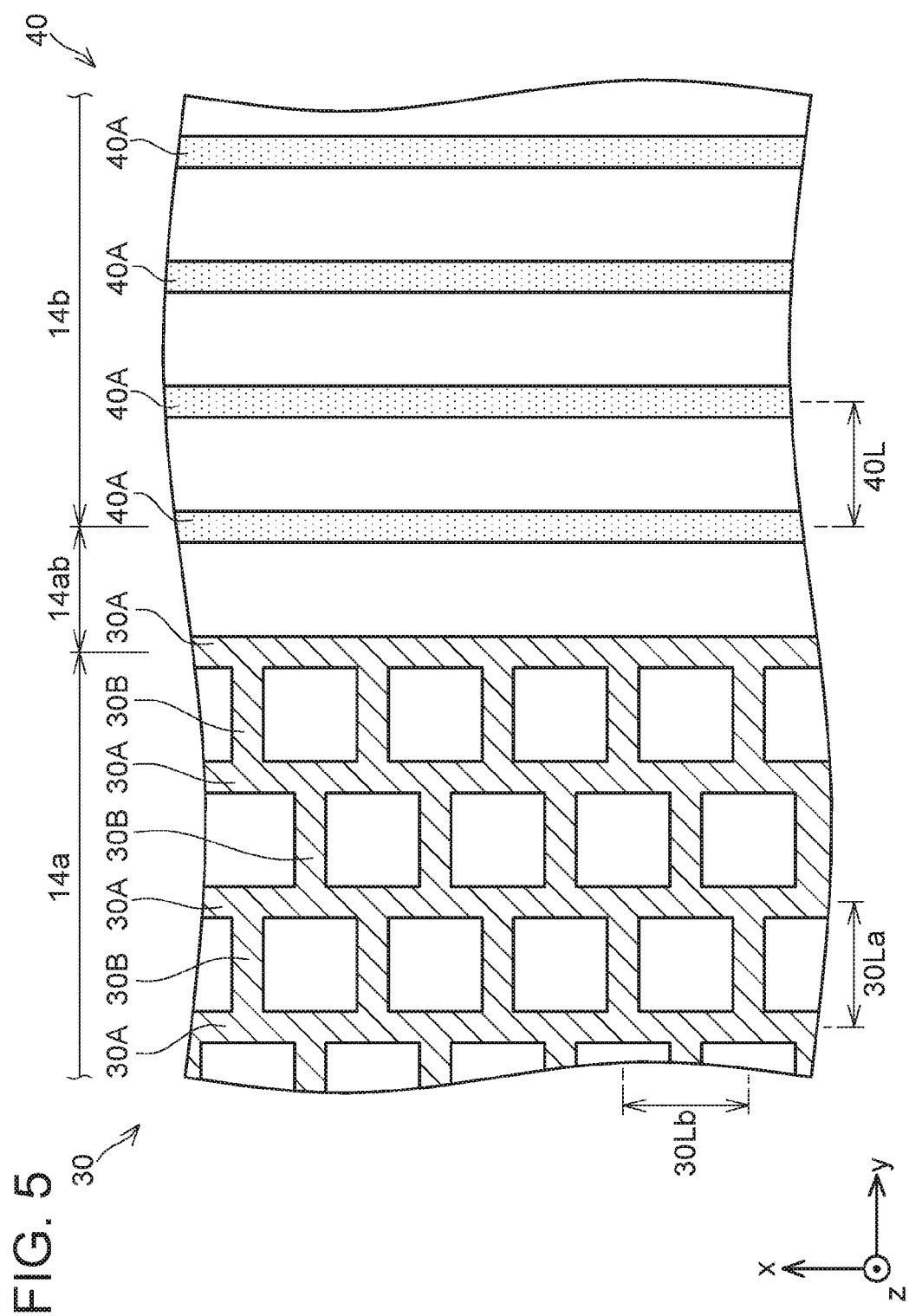
FIG. 5 schematically shows an example of layouts of a trench gate member and a dummy trench member.

FIG. 5 is a diagram schematically showing the layouts of the trench gate member 30 and the dummy trench member 40. For convenience, diagonal hatching is used to show the trench gate member 30 and dot hatching is used to show the dummy trench member 40.

The trench gate members 30 provided in each IGBT region 14a include a plurality of first trench gates 30A and a plurality of second trench gates 30B. The plurality of first trench gates 30A extends along the x-axis direction. The plurality of second trench gates 30B extends along the y-axis direction between adjacent first trench gates 30A. A pitch length (30La) of the plurality of first trench gates 30A in the y-axis direction and a pitch length (30Lb) of the plurality of second trench gates 30B in the x-axis direction are equal to each other. For this reason, a ring-like portion constituted by a pair of the first trench gates 30A and a pair of the second trench gates 30B has a square shape. In one example, each of these pitch lengths (30La, 30Lb) ranges from 4 to 6 µm. The first trench gates 30A have their ends extending into the terminal portion 16 (see FIG. 1), in which the trench gate electrodes 34 are electrically connected to gate wires.

The dummy trench members 40 provided in each diode region 14b include a plurality of stripe dummy trenches 40A extending along the x-axis direction. That is, the plurality of stripe dummy trenches 40A extends in parallel to the first trench gates 30A. of the trench gate member 30. A pitch length (40L) of the plurality of stripe dummy trenches 40A in the y-axis direction is equal to the pitch length (30La) of the plurality of first trench gates 30A in the y-axis direction and the pitch length (30Lb) of the plurality of second trench gates 30B in the x-axis direction. In one example, the pitch length (40L) of the plurality of stripe dummy trenches 40A in the y-axis direction ranges from 4 to 6 µm The plurality of stripe dummy trenches 40A have their ends extending into the terminal portion 16 (see FIG. 1). Adjacent stripe dummy trenches 40A may be configured to be coupled to each other in the terminal portion 16. In this example, the dummy trench electrodes 44 of the stripe dummy trenches 40A are electrically connected to the emitter electrode 38. In another example, the dummy trench electrodes 44 of the stripe dummy trenches 40A may have a floating potential.

Figure 6:
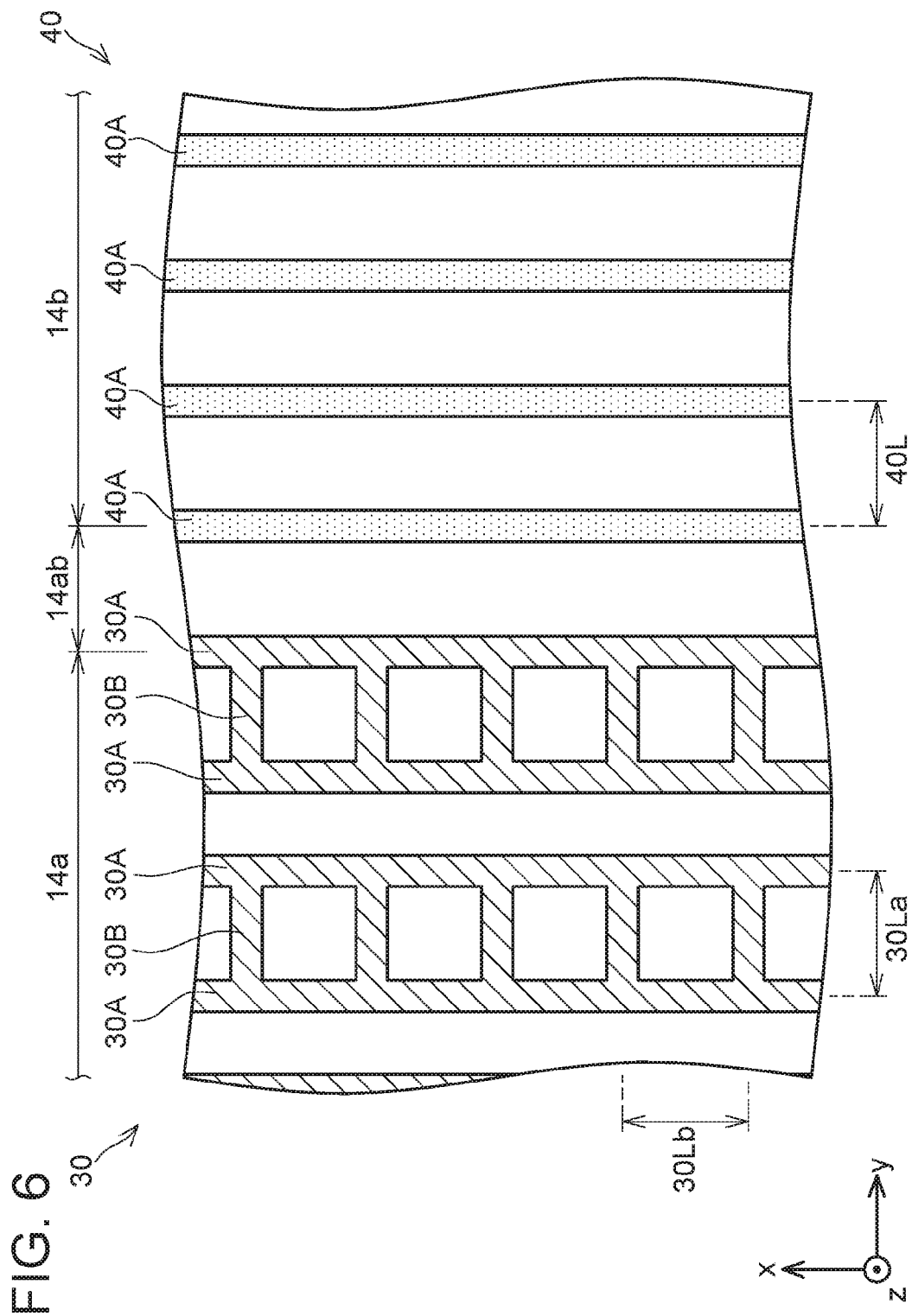
FIG. 6 schematically shows an example of layouts of the trench gate member and the dummy trench member.
Figure 7:
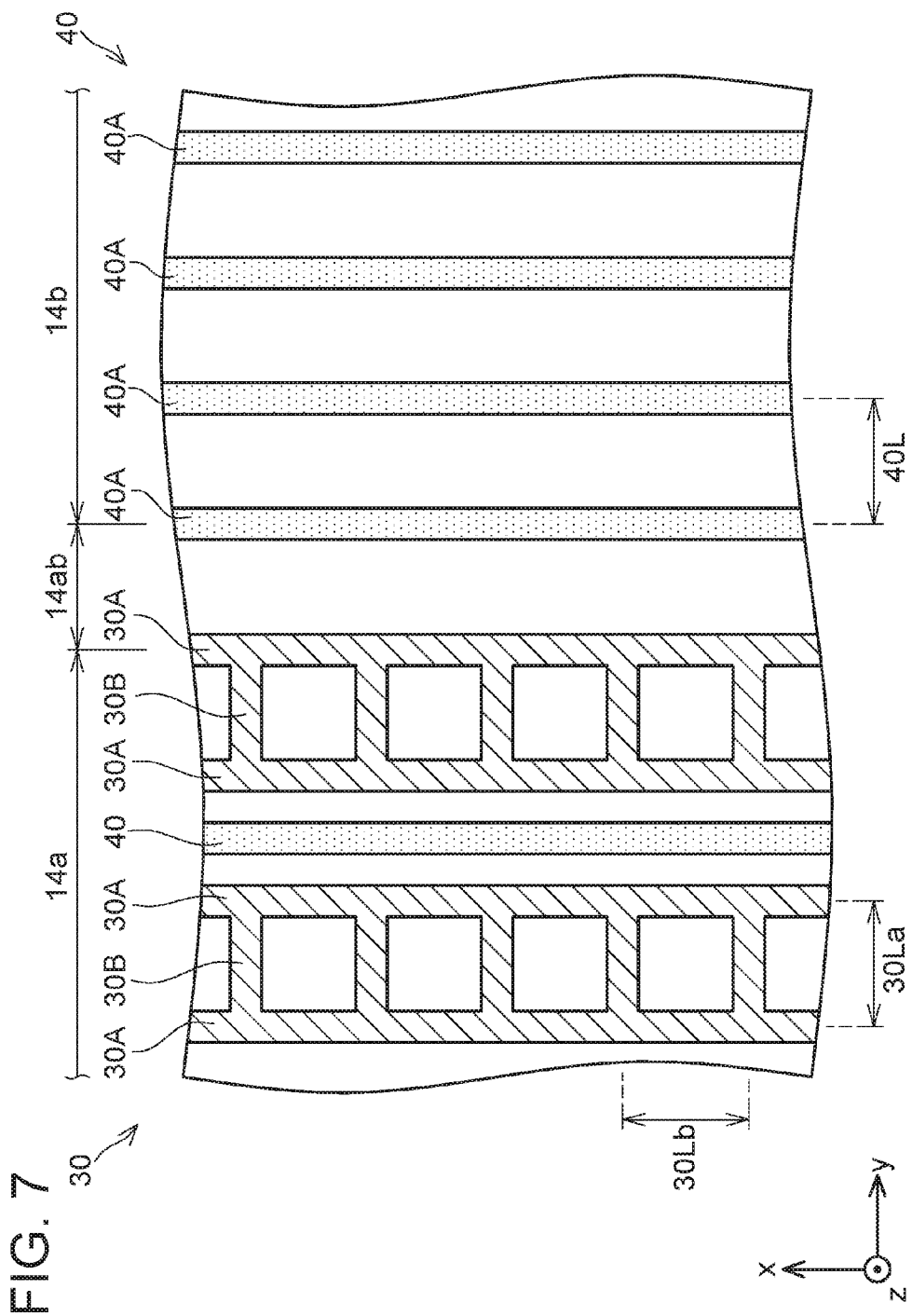
FIG. 7 schematically shows an example of layouts of the trench gate member and the dummy trench member.

It should be noted that the layouts shown in FIG. 5 are merely an example and other layouts can be employed for the trench gate members 30 and the dummy trench members 40. For example, as shown in FIG. 6, each french gate member 30 may have a lattice-pattern layout to be divided into a plurality of parts arranged in the y-axis direction. In this example, each of the parts into which the trench gate member 30 has been divided is constituted by a pair of first trench gates 30A and a plurality of second trench gates 30B to have a ladder-pattern layout, Further, as shown in FIG. 7, the dummy trench member 40 may be provided between divided trench gate members 30.

Figure 4:
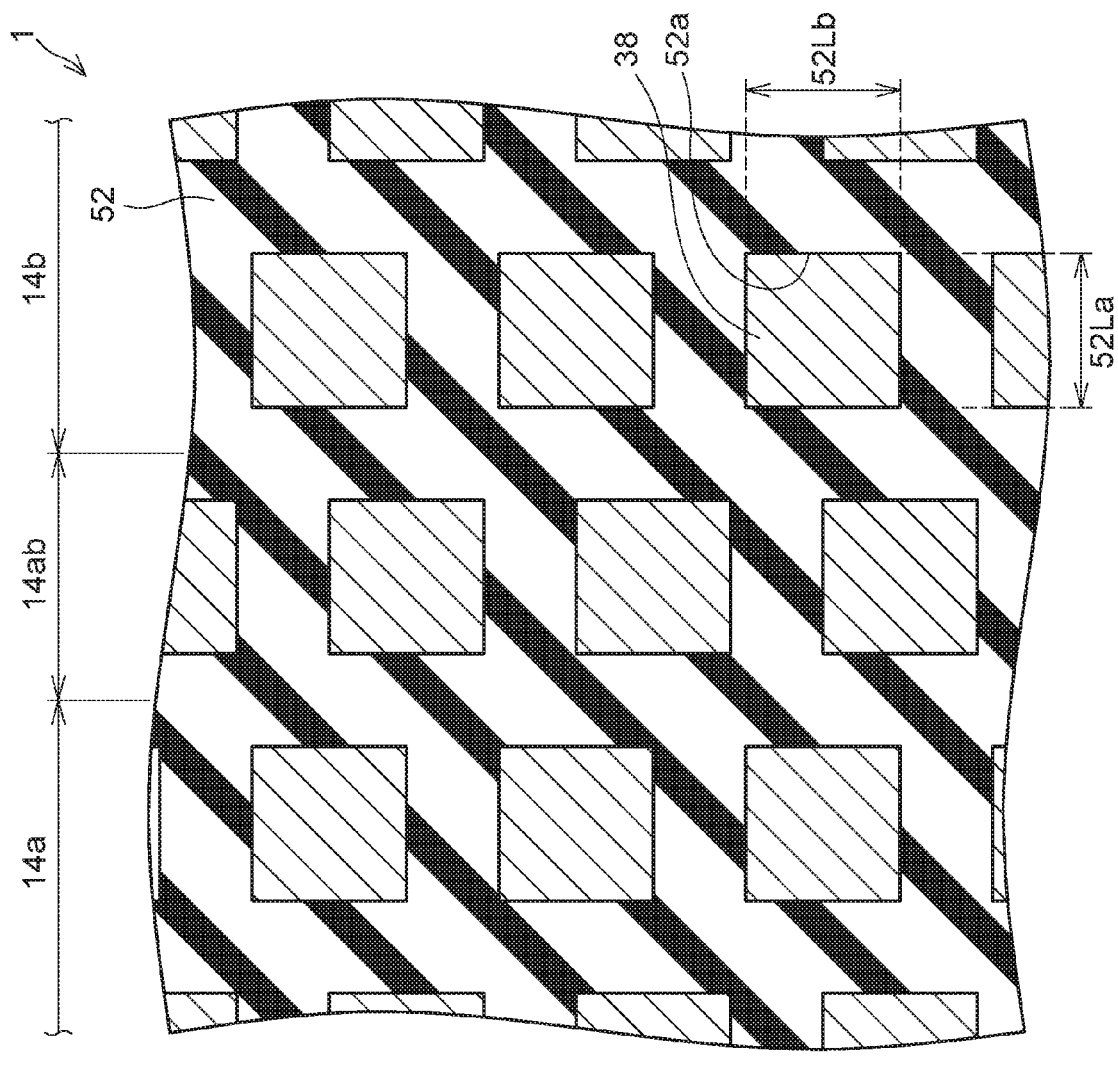
FIG. 4 is a cross-sectional view schematically showing an interlayer insulation film of the reverse conducting IGBT (i.e. a cross-sectional view taken along the line IV-IV in FIG. 2)

FIG. 4 shows a layout of the interlayer insulation film 52 provided on the top surface of the semiconductor substrate 10. The interlayer insulation film 52 is provided between the top surface of the semiconductor substrate 10 and the emitter electrode 38. In the interlayer insulation film 52, a plurality of openings 52a is provided so that the emitter electrode 38 is in contact with the top surface of the semiconductor substrate 10. For this reason, the interlayer insulation film 52 is configured to have a lattice-pattern layout. The plurality of openings 52a of the interlayer insulation film 52 in each IGBT region 14a includes openings 52a dispersedly arranged so as to correspond to top surface portions of the semiconductor substrate 10 that are each enclosed by the lattice-patterned trench gate member 30. The plurality of openings 52a of the interlayer insulation film 52 in the diode region 14b includes openings 52a dispersedly arranged along the x-axis direction corresponding to a top surface portion of the semiconductor substrate 10 between adjacent stripe trenches 40A. The plurality of openings 52a of the interlayer insulation film 52 in each boundary region 14ab includes openings 52a dispersedly arranged along the x-axis direction corresponding to a top surface portion of the semiconductor substrate 10 between a first trench gate 30A and a stripe dummy trench 40A. The plurality of openings 52a of the interlayer insulation film 52 has a repeated pattern of common shapes across the whole ranges of the IGBT regions 14a, the diode regions 14b, and the boundary regions 14ab. In this example, the plurality of openings 52a of the interlayer insulation film 52 has a form (square shape) that is similar to the ring-like portion of the trench gate member 30. For this reason, the plurality of openings 52a of the interlayer insulation film 52 has a repeated pattern of square shapes across the whole ranges of the IGBT regions 14a, the diode regions 14b, and the boundary regions 14ab.

Thus, in the reverse conducting IGBT 1, the collector electrode 36, the collector region 21, the drift region 23, the barrier region 24, the body region 25, the emitter regions 27, the emitter electrode 38, and the trench gate members 30 constitute the IGBT structure. In the reverse conducting IGBT 1, the collector electrode 36, the cathode regions 22, the drift region 23, the barrier region 24, the body region 25, the pillar regions 26, the emitter electrode 38, and the dummy trench members 40 constitute the diode structure. The collector electrode 36 functions as a cathode electrode in the diode structure, and the emitter electrode 38 functions as an anode electrode in the diode structure. Further, the body region 25 functions as an anode region in the diode structure.

The following describes how the reverse conducting IGBT 1 operates. First, how the IGBT structure in the IGBT regions 14a operates is described. When a higher potential is applied to the collector electrode 36 than that which is applied to the emitter electrode 38 and a potential which is equal to or higher than a threshold value is applied to the trench gate electrode 34, a channel is provided in the body region 25 located on a side surface of the trench gate insulation film 32, so that the IGBT structure is turned on. At this point in time, electrons flow from the emitter electrode 38 toward the collector electrode 36 via the channel in the body region 25, the barrier region 24, the drift region 23, and the collector region 21. Meanwhile, holes flow from the collector electrode 36 toward the emitter electrode 38 via the collector region 21, the drift region 23, the barrier region 24, and the body region 25. Thus, when the IGBT structure is turned on, a current flows from the collector electrode 36 toward the emitter electrode 38. After that, when the potential of the trench gate electrode 34 is lowered to a potential which is lower than the threshold value, the channel disappears, so that the IGBT structure is turned off Each trench gate member 30 provided in the IGBT region 14a has a lattice-pattern layout. For this reason, while the IGBT structure is on, there are increases in electron concentration in channels at our corners of the trench gate member 30, and thus there is a reduction in channel resistance. Further, the increases in electron concentration in the channels lead to an increase in hole concentration in the drift region 23, thus activating conductivity modulation. Furthermore, in the IGBT structure, where the barrier region 24 is provided in the IGBT region 14a, the barrier region 24 exerts a carrier storage effect to cause a remarkable increase in hole concentration in the drift region 23, thus causing a remarkable reduction in on voltage. Thus, in the IGBT structure, the provision of the trench gate member 30 having a lattice-pattern layout leads to a reduction in power loss.

Next, how the diode structure in the diode regions 14b operates is described. When a higher potential is applied to the emitter electrode 38 than that which is applied to the collector electrode 36, a return current flows through the diode structure. The following description assumes a case where the potential of the emitter electrode 38 is gradually raised from a potential which is equivalent to that of the collector electrode 36. A rise in the potential of the emitter electrode 38 causes a Schottky junction between the pillar region 26 and the emitter electrode 38 to conduct. This causes electrons to flow from the collector electrode 36 toward the emitter electrode 38 via the cathode regions 22, the drift region 23, the barrier region 24, and the pillar regions 26. Thus, when the potential of the emitter electrode 38 is comparatively low, a Schottky barrier diode in the diode structure becomes electrically conducted, so that a current flows from the emitter electrode 38 toward the collector electrode 36.

The conduction of the Schottky barrier diode causes a potential of the barrier region 24 to be maintained at a potential which is close to the potential of the emitter electrode 38, thus keeping down a voltage that is applied in the forward direction of a p-n junction constituted by the body region 25 and the barrier region 24. For this reason, when the potential of the emitter electrode 38 is comparatively low, a p-n diode in the diode structure does not conduct. When the potential of the emitter electrode 38 becomes comparatively high, there is an increase in current that flows through the Schottky barrier diode. The increase in current that flows through the Schottky barrier diode leads to an increase in potential difference between the emitter electrode 38 and the barrier region 24 and also to an increase in the voltage that is applied, in the forward direction of the p-n junction constituted by the body region 25 and the barrier region 24, so that holes are injected from the body region 25 via the barrier region 24. This causes holes to flow from the emitter electrode 38 toward the collector electrode 36 via the body region 25, the barrier region 24, the drift region 23, and the cathode regions 22. Meanwhile, electrons flow from the collector electrode 36 toward the emitter electrode 38 via the cathode regions 22, the drift region 23, the barrier region 24, and the body region 25. Thus, when the potential of the emitter electrode 38 is comparatively high, the p-n diode in the diode structure becomes electrically conducted.

In the diode structure, as just described, the Schottky barrier diode becomes electrically conducted first when the potential of the emitter electrode 38 rises. This delays the timing at which the p-n diode starts to conduct. Thus, when a return current flows through the diode structure, the number of holes injected from the body region 25 into the drift region 23 is reduced. After that, when a higher potential is applied to the collector electrode 36 than a potential applied to the emitter electrode 38, the p-n diode in the diode structure performs a reverse recovery operation. At this point in time, since the number of holes injected from the body region 25 into the drift region 23 has been reduced, there is also a reduction in reverse current by which the p-n diode in the diode structure performs a reverse recovery operation. Thus, in the diode region, the provision of the barrier region 24 and the pillar regions 26 leads to an improvement in the reverse recovery characteristics.

The following describes the features of the reverse conducting IGBT 1. As shown in FIG. 3, the dummy trench member 40 provided in the diode region 14b has a stripe-pattern layout of stripes extending in the x-axis direction. For this reason, the barrier region 24 (see FIG. 2) provided in the diode region 14b spreads over a wide area along the x-axis direction across the entire range of the diode region 14b. Further, the part of the pillar region 26 provided in the diode region 14b extends along the x-axis direction across the entire range of the diode region 14b in correspondence with the bather region 24 spreading over the wide area along the x-axis direction. For this reason, an exposed surface of each pillar region 26 that is exposed at the top surface of the semiconductor substrate 10 extends along the x-axis direction across the entire range of the diode region 14b. This ensures an area of the exposed surfaces of the pillar regions 26 per one barrier region 24 to become large, thus ensuring an electrical connection between the pillar regions 26 and the emitter electrode 38 even if there occurs a malformation (e.g. a lack of impurity concentration) in a part of the exposed surfaces of the pillar regions 26. This enables the barrier region 24 to reduce the number of holes injected from the body region 25 into the drift region 23 and thus improve the reverse recovery characteristics of the diode structure.

Figure 8:
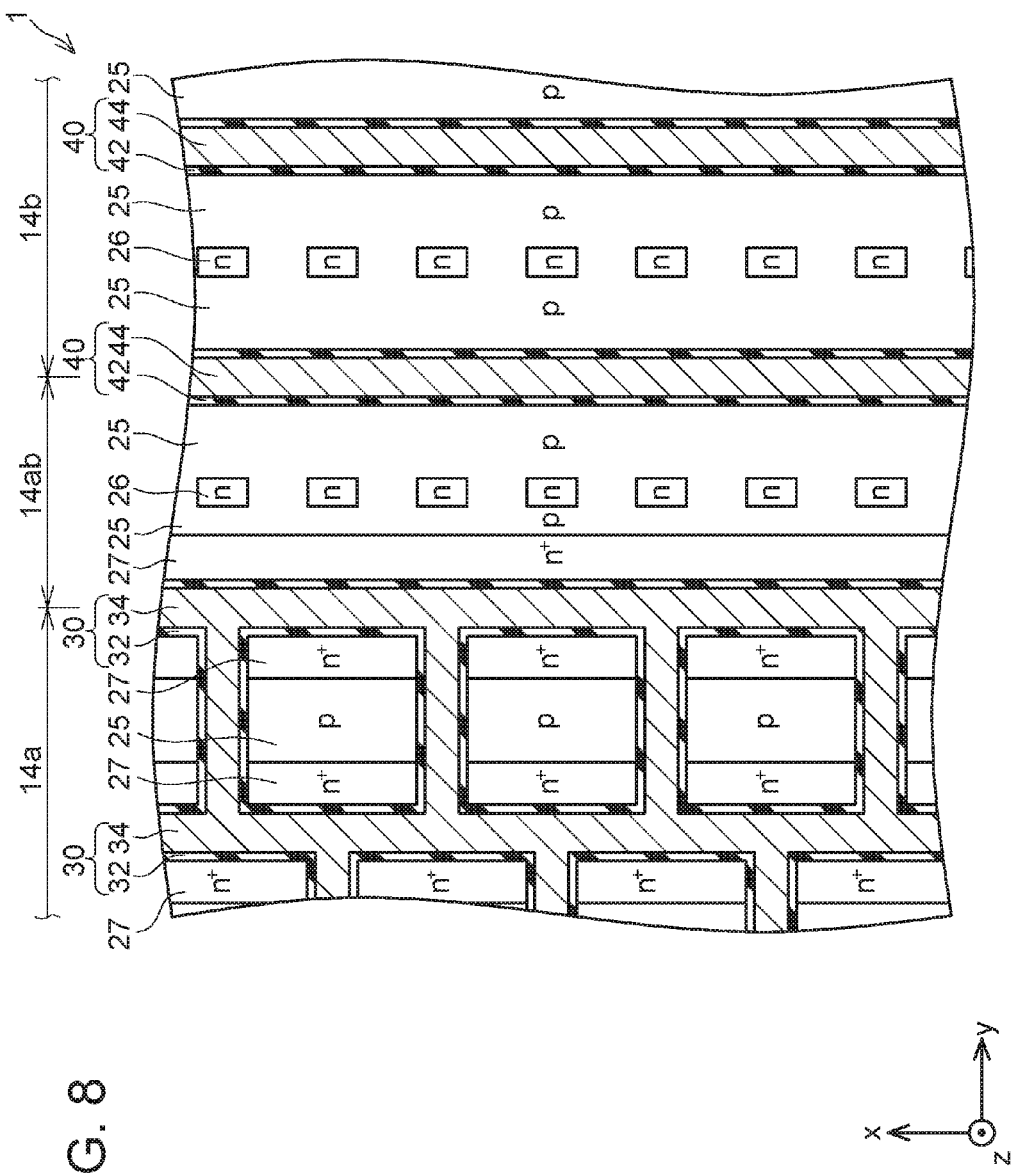
FIG. 8 is a top view schematically showing the semiconductor substrate of the reverse conducting IGBT.

As shown in FIG. 8, exposed surfaces of the pillar regions 26 that are exposed at the top surface of the semiconductor substrate 10 may be dispersedly arranged along the x-axis direction across the entire range of the diode region 14B. This also ensures the wide area of an exposed surface of the pillar region 26 for each barrier region 24, thus ensuring an electrical connection between the pillar region 26 and the emitter electrode 38 even if there occurs a malformation in a part of the exposed surface of the pillar region 26.

As shown in FIG. 4, the plurality of openings 52a of the interlayer insulation film 52 has a repeated pattern of square shapes across the whole ranges of the IGBT regions 14a, the diode regions 14b, and the boundary regions 14ab. In manufacturing the reverse conducting IGBT 1, the emitter electrode 38 is formed by a vapor deposition technique to cover the top surface of the semiconductor substrate 10 after the interlayer insulation film 52 has been patterned on the top surface of the semiconductor substrate 10. Since the plurality of openings 52a of the interlayer insulation film 52 has a repeated pattern of square shapes, a surface of the emitter electrode 38 thus formed is flattened. Although the trench gate members 30 and the dummy trench members 40 have different layouts, flattening of the surface of the emitter electrode 38 is achieved, as the interlayer insulation film 52 has a uniform layout across the whole ranges of the IGBT regions 14a, the diode regions 14b, and the boundary regions 14ab. This prevents a faulty bonding between the emitter electrode 38 and a wire or solder at the time of wire bonding or soldering to the emitter electrode 38. This raises expectations for an improvement in bonding reliability (power cycle).

Figure 9:
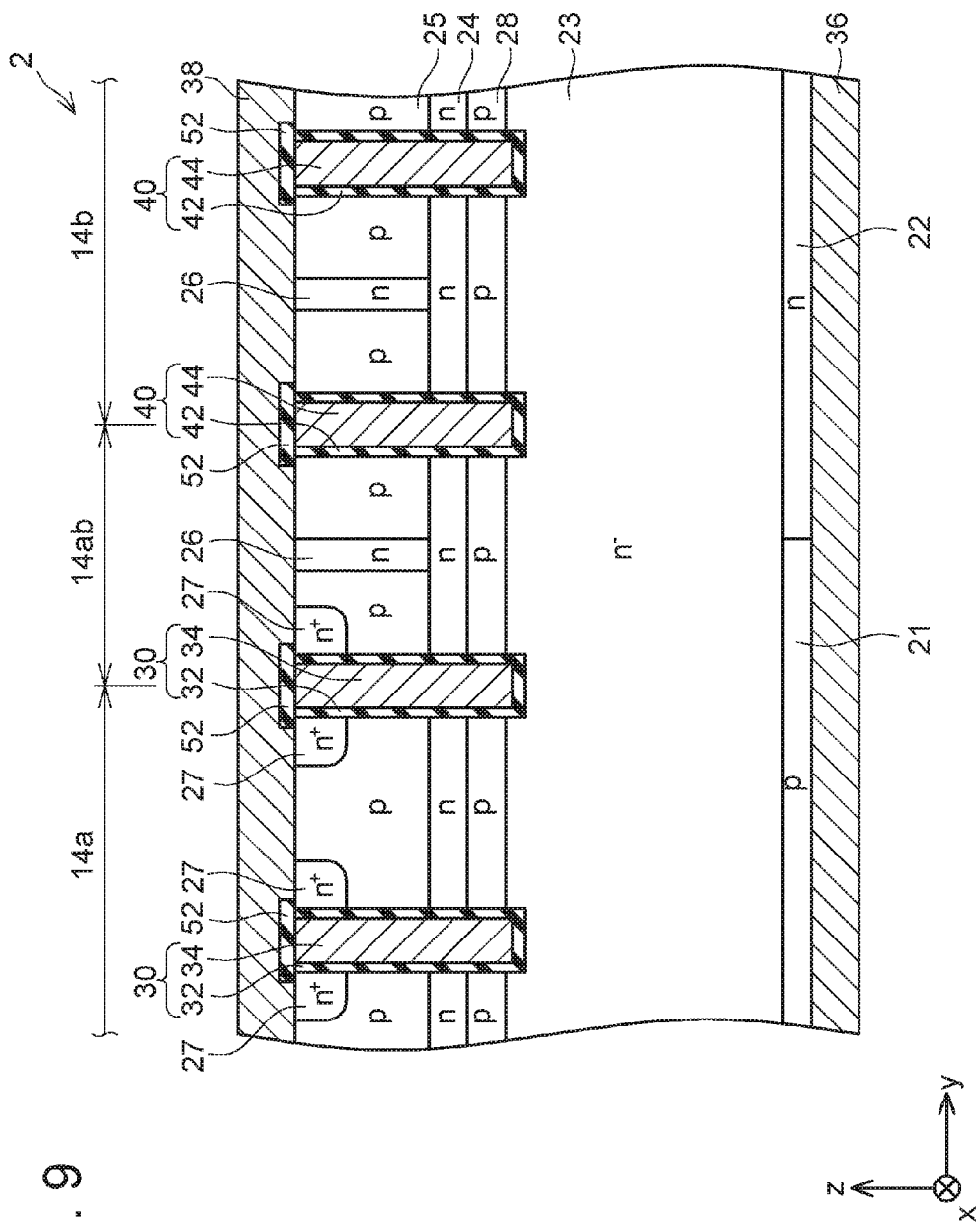
FIG. 9 is a cross-sectional view schematically showing main components in a boundary range between an IGBT region and a diode region of a reverse conducting IGBT according to a modification.

FIG. 9 shows a reverse conducting IGBT 2 according to a modification. The semiconductor substrate 10 of this reverse conducting IGBT 2 includes a p-type electric field expansion prevention region 28 provided between the drift region 23 and the barrier region 24.

The electric field expansion prevention region 28 is disposed in the IGBT regions 14a, the diode regions 14b, and the boundary regions 14ab. The electric field expansion prevention region 28 is provided between the drift region 23 and the body region 25, The electric field expansion prevention region 28 is formed, for example, by introducing boron through the top surface of the semiconductor substrate 10 by utilizing the ion implantation technique. In one example, the electric field expansion prevention region 28 has a peak impurity concentration of $1 \times 10^{15}$ to $1 \times 10^{18}$ cm$^{-3}$ and a thickness of 0.2 to 3 μm.

Provision of such an electric field expansion prevention region 28 causes a p-n diode constituted by the electric field expansion prevention region 28 and the drift region 23 to be disposed in a direction opposite to a current pathway from the collector electrode 36 toward the emitter electrode. This achieves a reduction in leak current. Especially in the diode region 14b, the electric field expansion prevention region 28 can reduce a leak current flowing through a Schottky junction between the pillar regions 26 and the emitter electrode 38.

Figure 10:
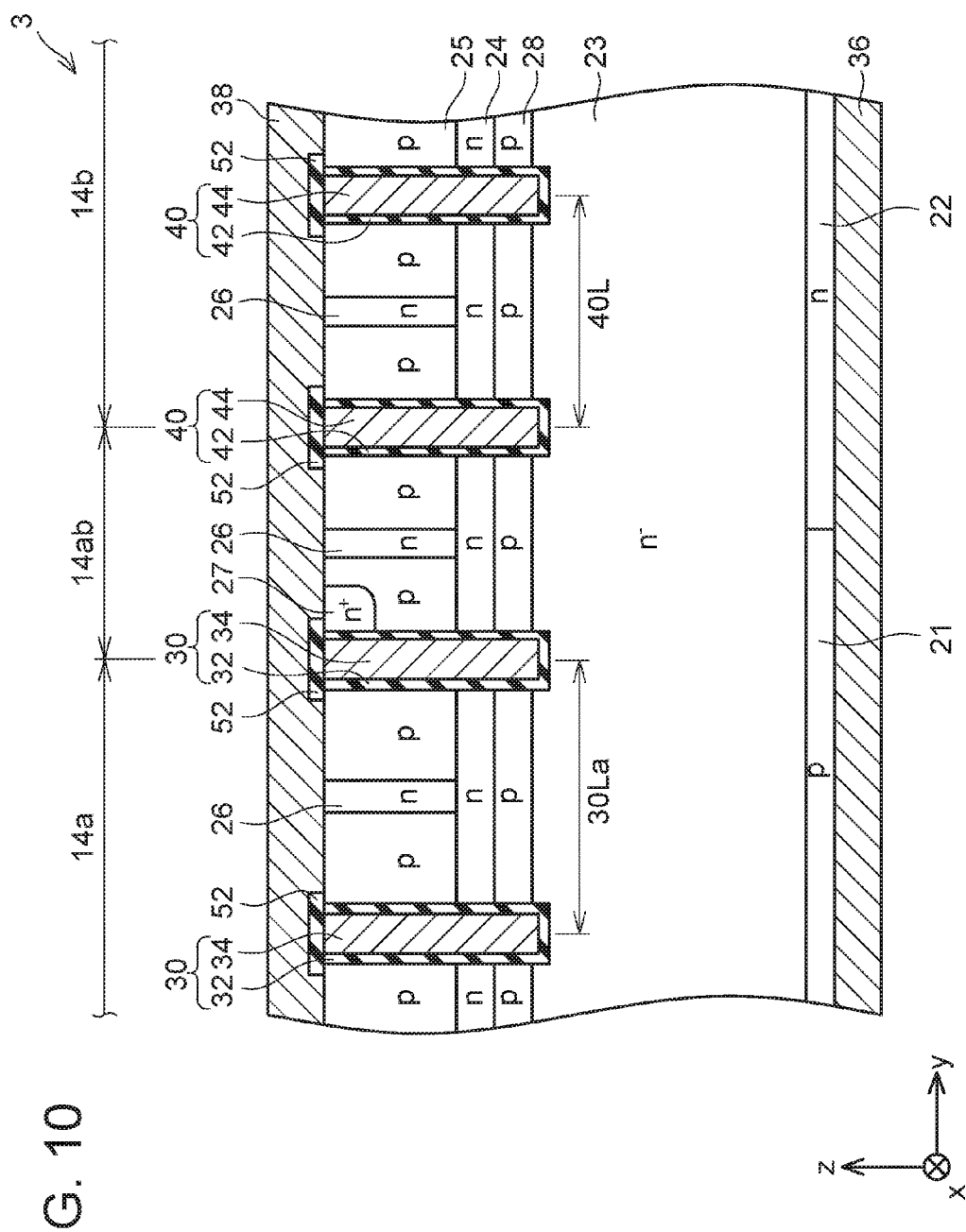
FIG. 10 is a cross-sectional view schematically showing main components in a boundary range between an IGBT region and a diode region of a reverse conducting IGBT according to a modification (i.e. a cross-sectional view taken along the line X-X in FIG. 11)
Figure 11:
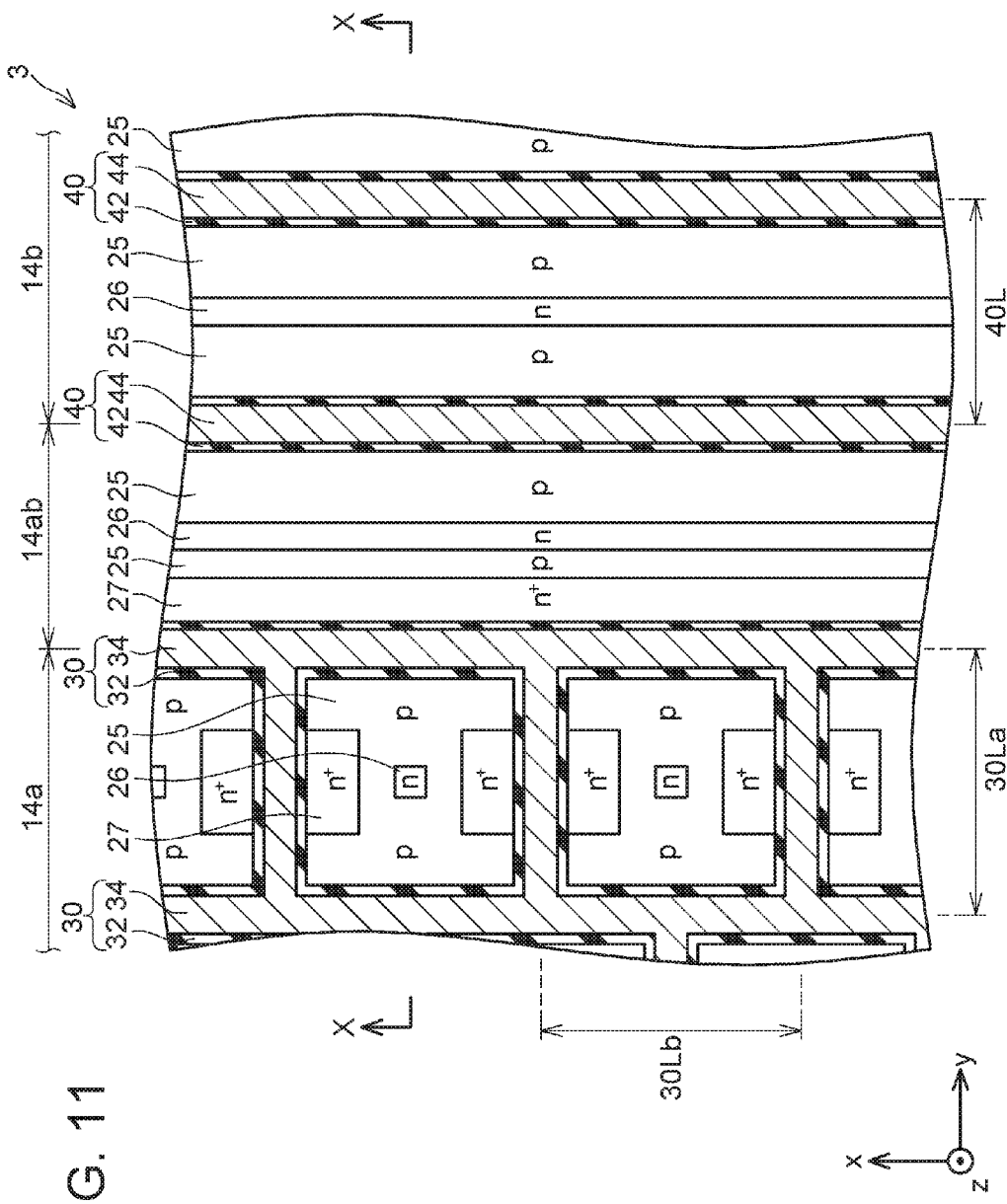
FIG. 11 is a top view schematically showing a semiconductor substrate of the reverse conducting IGBT according to the modification.
Figure 12:
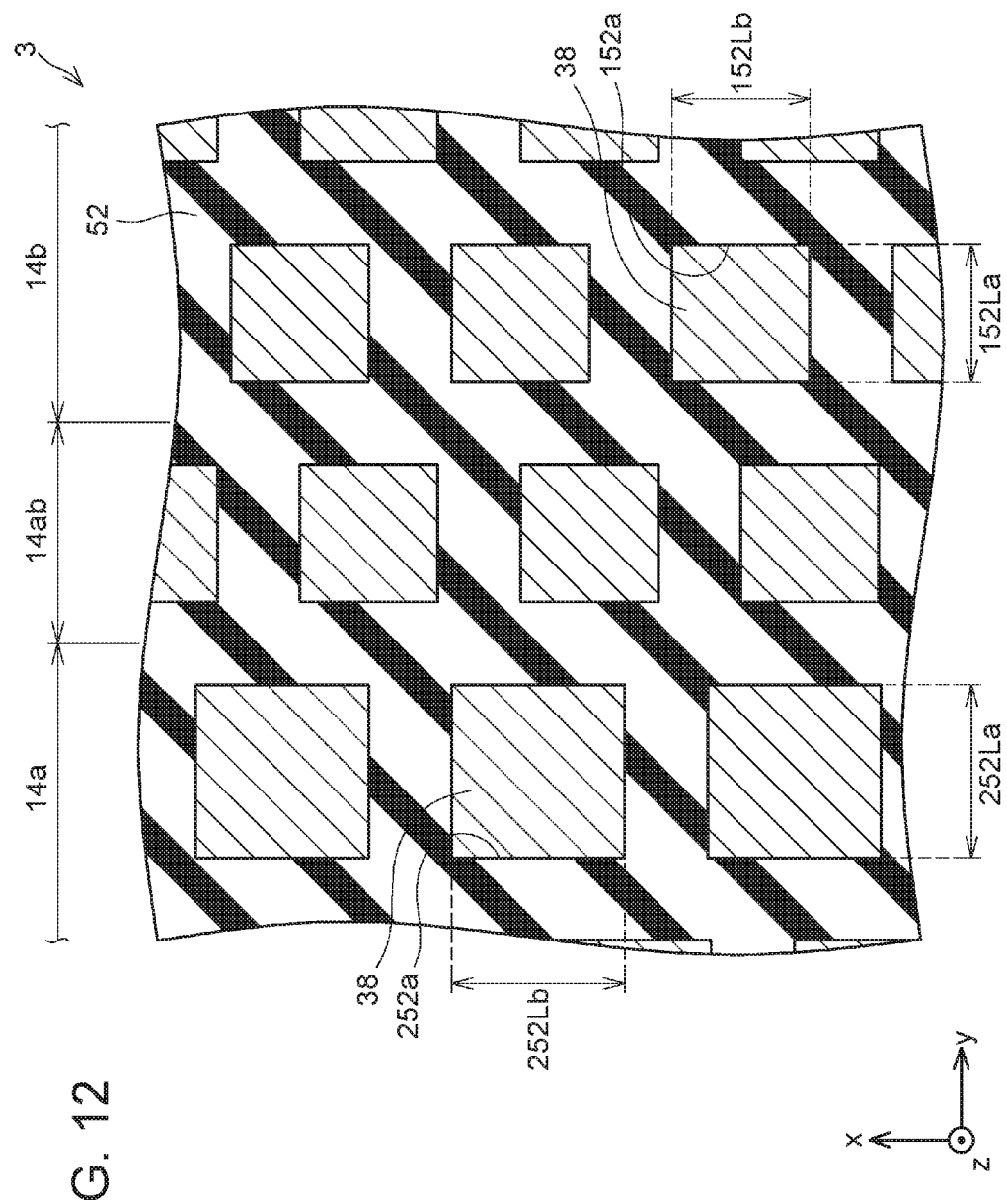
FIG. 12 is a cross-sectional view schematically showing an interlayer insulation film of the reverse conducting IGBT according to the modification.

FIGS. 10 to 12 show a reverse conducting IGBT 3 according to a modification. The reverse conducting IGBT 3 is configured such that the pitch lengths of the trench gate members 30 and the pitch length of the dummy trench members 40 are different from each other. Furthermore, the reverse conducting IGBT 3 is configured such that the pillar regions 26 are also provided in the IGBT regions 14a of the semiconductor substrate 10.

As shown in FIG. 11, the pitch length 30La of the plurality of first trench gates 30A in the y.-axis direction is longer than the pitch length 40L of the plurality of stripe dummy trenches 40A in the y-axis direction. Furthermore, the pitch length 30Lb of the plurality of second trench gates 30B in the x-axis direction is longer than the pitch length 40L of the plurality of stripe dummy trenches 40A in the y-axis direction. The pitch length 30La of the plurality of first trench gates 30A in the y-axis direction and the pitch length 30Lb of the plurality of second trench gates 30B in the x-axis direction are equal to each other. In one example, each of the pitch lengths (30La, 30Lb) of the trench gate member 30 is 6 μm, and the pitch length (40L) of the dummy gate member 40 is 4 μm.

As noted above, provision of the trench gate members 30 having a lattice-pattern layout leads to an increase in carrier concentration of the IGBT regions 14a, and so that power loss in the IGBT structure is reduced. In other words, the trench gate members 30 having the lattice-pattern layout can suppress an increase in power loss in the IGBT structure even if the pitch lengths of the trench gate members 30 are long. For this reason, in the IGBT structure, lengthening the pitch lengths of the trench gate member 30 makes it possible to suppress an increase in power loss and, in parts of the semiconductor substrate 10 enclosed by the trench gate members 30, ensure wide exposed surfaces of the pillar regions 26 exposed at the top surface of the semiconductor substrate 10. This enables the reverse conducting IGBT 3 to ensure a satisfactory electrical connection between the pillar regions 26 and the emitter electrode 38 also in the IGBT regions 14a.

In this type of reverse conducting IGBT 3, it is desirable that in an operation mode in which the diode structure becomes electrically conducted, holes be adequately injected from the body region 25 toward the drift region 23 in the IGBT regions 14a so that there is a reduction in power loss in the operation mode in which the diode structure becomes electrically conducted. Meanwhile, a large number of holes injected from the body region 25 toward the drift region 23 in the IGBT regions 14a deteriorates the reverse recovery characteristics of the diode structure. In the reverse conducting IGBT 3, the pillar regions 26 are also provided in the IGBT regions 14a. This prevents a large number of holes from being injected from the body region 25 toward the drift region 23 in the IGBT regions 14a when the diode structure in the diode regions 14b becomes electrically conducted. This reduces power loss in the operation mode in which the diode structure becomes electrically conducted, and also suppresses deterioration in the reverse recovery characteristics of the diode structure.

Further, the trench gate members 30 having the lattice-pattern layout make it possible to stabilize an in-plane potential in the IGBT regions 14a when the IGBT structure is turned off and satisfactorily generate a depletion layer in each IGBT region 14a. This causes a reduction in electric field strength at tips of the trench gate members 30 in the IGBT regions 14a. In other words, the trench gate members 30 having the lattice-pattern layout can suppress a reduction in switching capacity even if the pitch lengths of the trench gate members 30 are long. In this way, even when the pitch lengths of the trench gate members 30 and the pitch length of the dummy trench members 40 are different from each other, the electric field strength is made uniform in the IGBT regions 14a and the diode regions 14b, and thus high switching capacity is achieved.

As noted above, in this type of reverse conducting IGBT 3, it is desirable that in the operation mode in which the diode structure conducts, holes be adequately injected from the body region 25 toward the drift region 23 in the IGBT region 14a. However, in this type of reverse conducting IGBT 3, a positive potential may be applied to the trench gate electrode 34 of the trench gate member 30 in the operation mode in which the diode structure conducts. In this case, the barrier region 24 is short-circuited with the emitter electrode 38 via a channel that is provided in a side surface of the trench gate member 30. For example, if the pitch lengths of the trench gate members 30 are short, the number of holes injected from the body region 25 toward the drift region 23 in each IGBT region 14a is remarkably reduced when the barrier region 24 is short-circuited with the emitter electrode 38 via the channel. That is, if the pitch lengths of the trench gate members 30 are short, the operation mode in which the diode structure conducts greatly varies in characteristic, depending on the potential that is applied to the trench gate members 30 (this phenomenon is called gate interference). On the other hand, in the reverse conducting IGBT 3, in which the pitch lengths of the trench gate member 30 are long, the number of holes injected from the body region 25 toward the drift region 23 in each IGBT region 14a is remarkably reduced even if the barrier region 24 is short-circuited with the emitter electrode 38 via the channel. The reverse conducting IGBT 3 has strong resistance to gate interference.

Further, since the pitch lengths of the trench gate members 30 and the pitch length of the dummy trench members 40 are different from each other, the reverse conducting IGBT 3 is also configured such that, as shown in FIG. 12, openings 152a and 252a that provided in the interlayer insulation film 52 are different in width from each other. The reverse conducting IGBT 3 is configured such that a y-axis direction length 152La and an x-axis direction length 152Lb of each of the openings 152a that are provided in the diode region 14b and the boundary region 14ab are configured to be shorter than a y-axis direction length 252La and an x-axis direction length 252Lb of each of the openings 252a that are provided in the IGBT region 14a. In such a case, too, the surface of the emitter electrode 38 is flattened, as the interlayer insulation film 52 has a lattice-pattern layout. This prevents a faulty bonding at the time of wire bonding or soldering to the emitter electrode 38. This raises expectations for an improvement in bonding reliability (power cycle).

Figure 13:
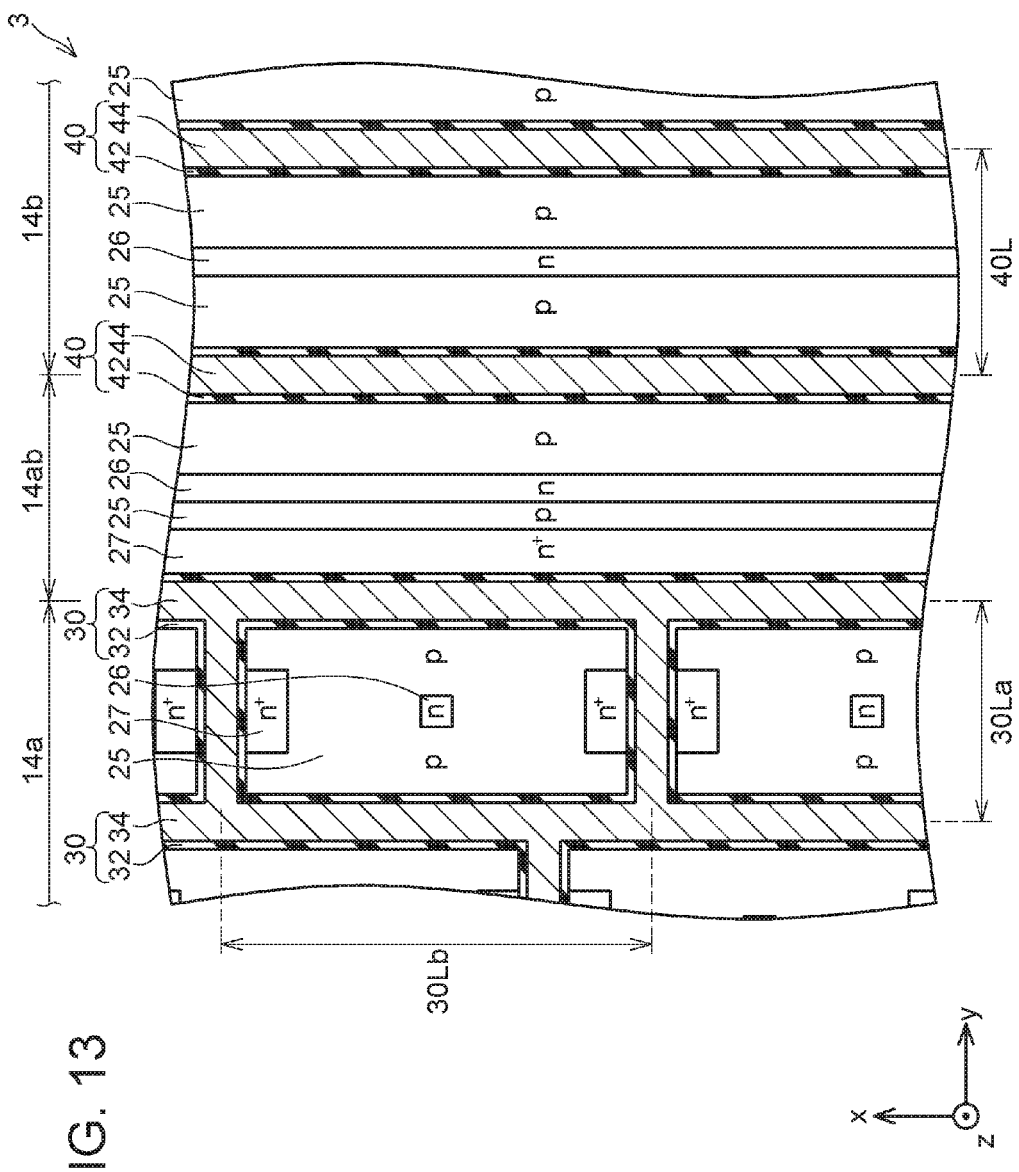
FIG. 13 is a top view schematically showing the semiconductor substrate of the reverse conducting IGBT according to the modification.
Figure 14:
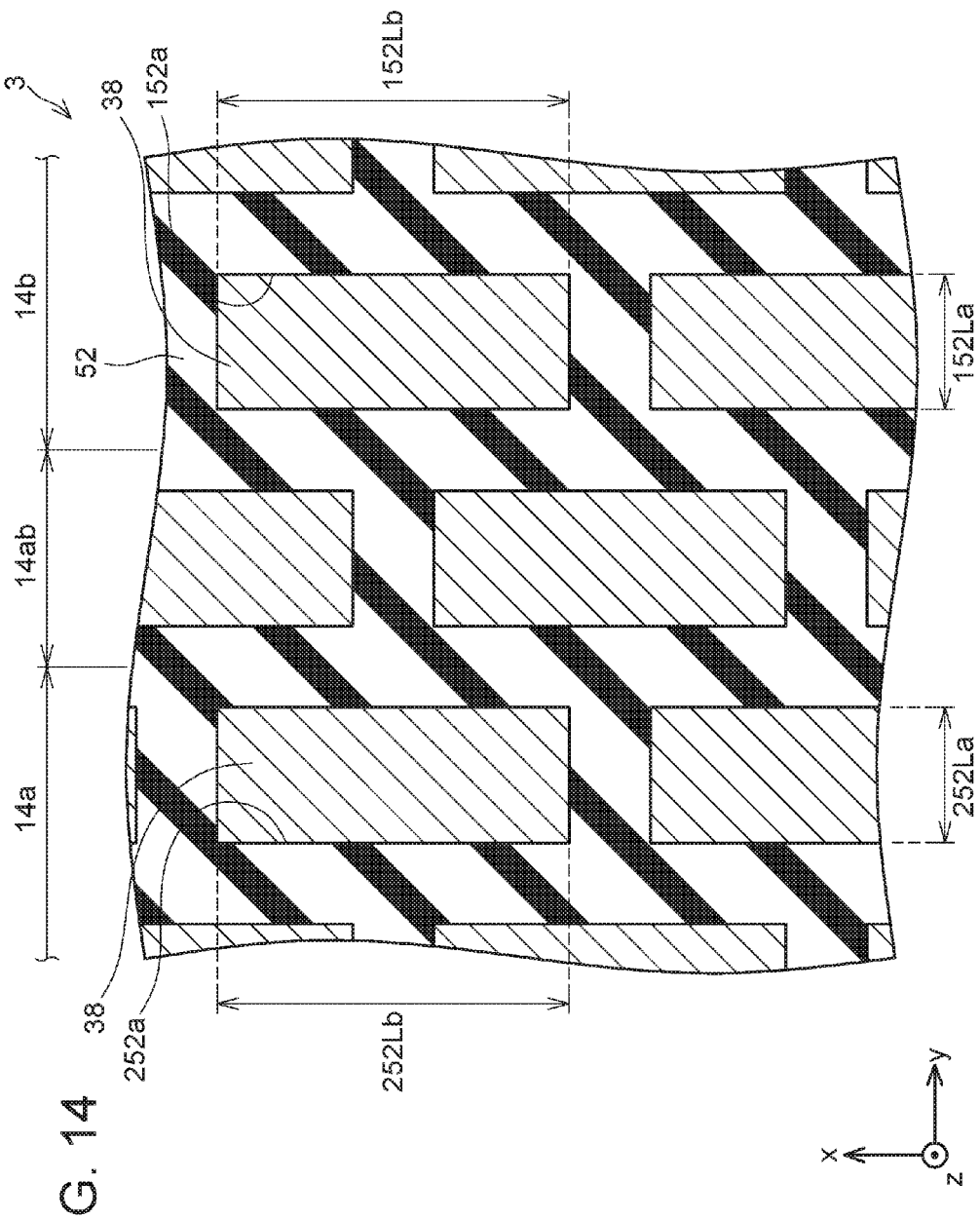
FIG. 14 is a cross-sectional view schematically showing the interlayer insulation film of the reverse conducting IGBT according to the modification.
Figure 15:
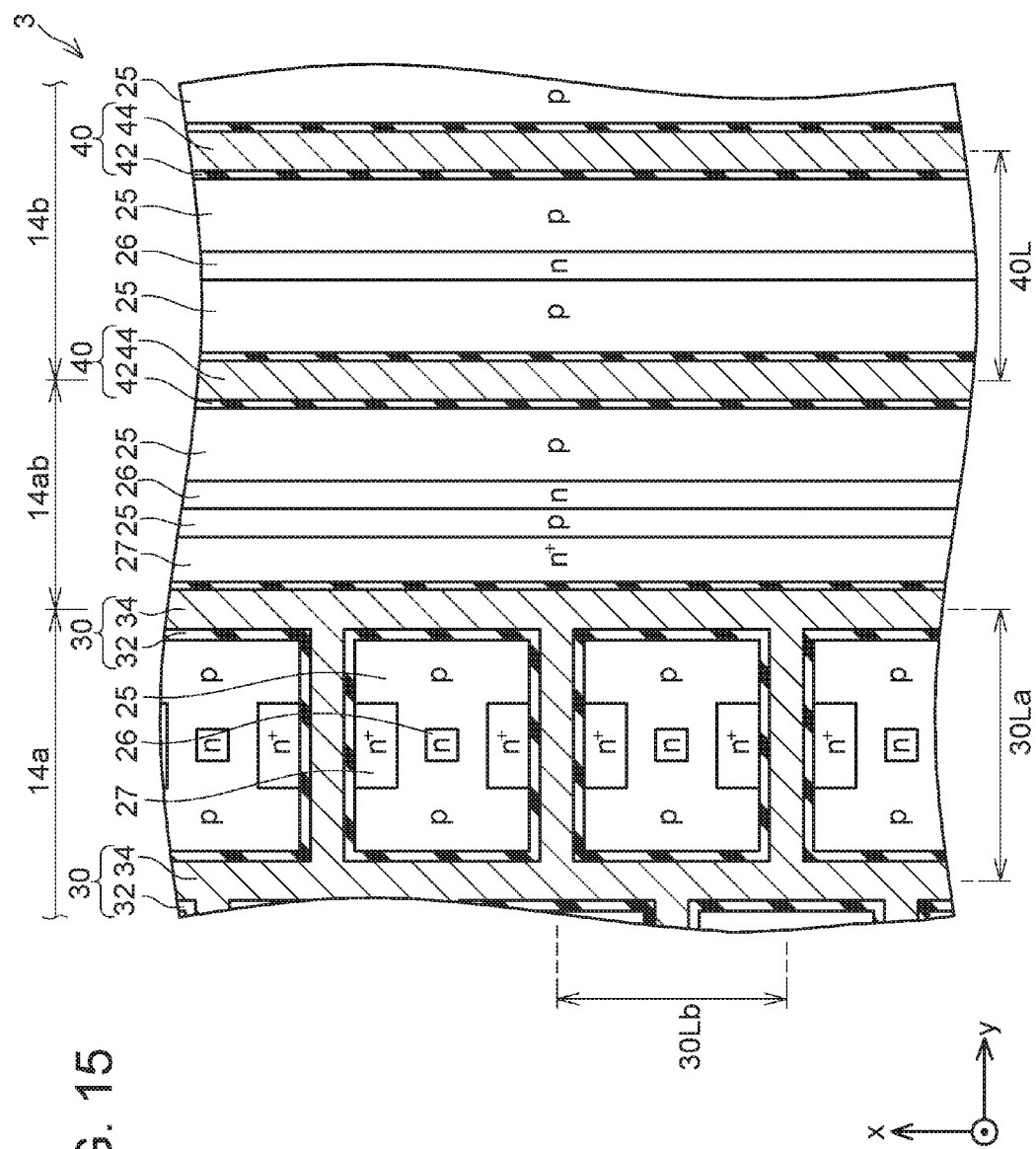
FIG. 15 is a top view schematically showing the semiconductor substrate of the reverse conducting IGBT according to the modification.
Figure 16:
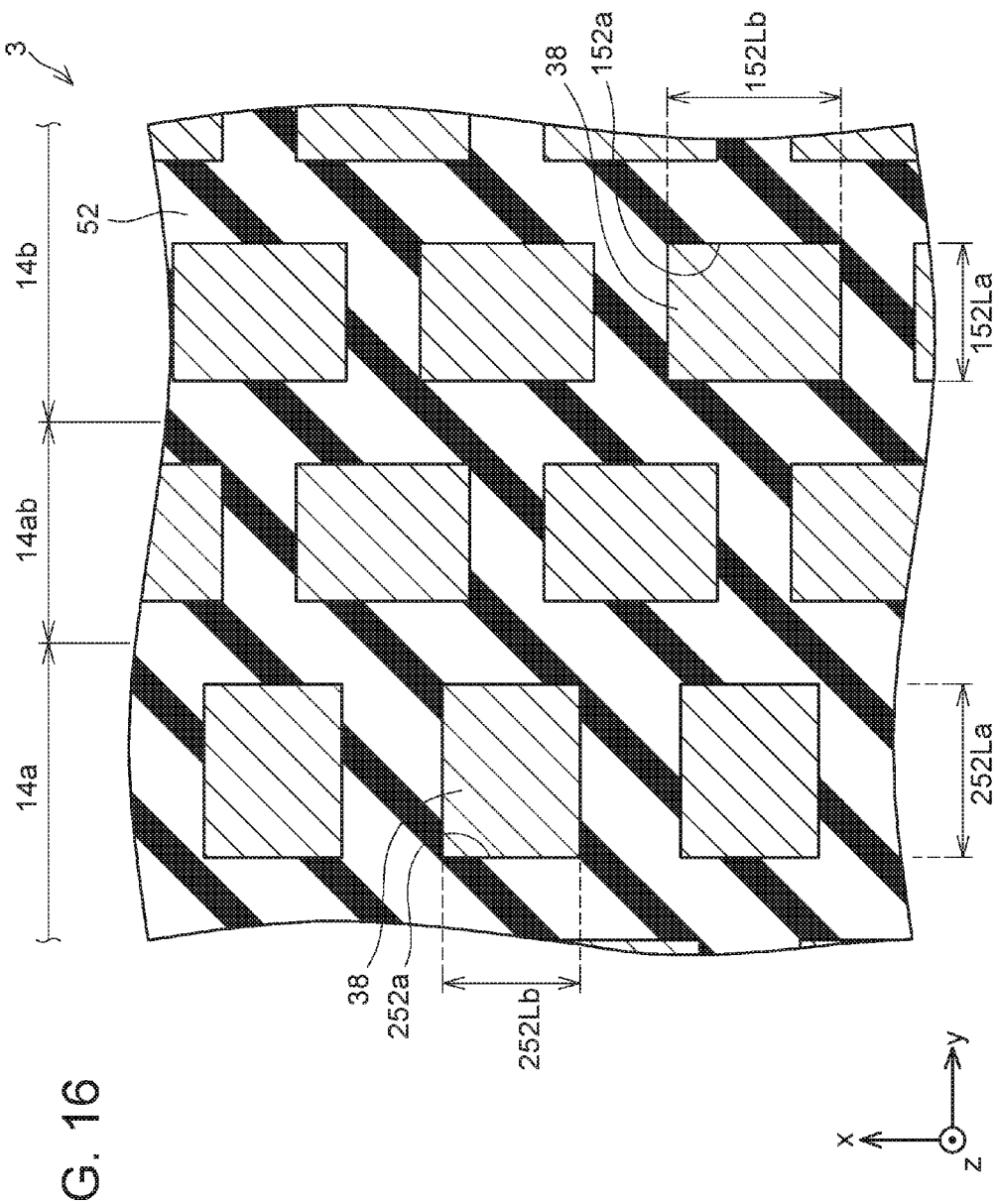
FIG. 16 is a cross-sectional view schematically showing the interlayer insulation film of the reverse conducting IGBT according to the modification.

As shown FIG. 4, it should be noted that the emitter electrode 38 has its surface roughness at the minimum when the plurality of openings 52a of the interlayer insulation film 52 has a repeated pattern of square shapes across the whole ranges of the IGBT regions 14a, the diode regions 14b, and the boundary regions 14ab. Meanwhile, as noted above, when the pitch lengths (30La, 30Lb) of the trench gate members 30 and the pitch length (40L) of the dummy trench members 40 are different front each other, some of the characteristics of the reverse conducting IGBT 3 are improved. In order to achieve both of these, as shown in FIG. 13, it is desirable that the pitch length 30La of the plurality of first trench gates 30A in the y-axis direction be equal to the pitch length 40L of the plurality of stripe dummy trenches 40A in the y-axis direction and that the pitch length 30Lb of the plurality of second trench gates 3013 in the x-axis direction be longer than the pitch length 40L of the plurality of stripe dummy trenches 40A in the y-axis direction. In this case, as shown in FIG. 14, the y-axis direction length 252La and the x-axis direction length 252Lb of each of the openings 252a that are provided in the IGBT region 14a are equal to the y-axis direction length 152La and the x-axis direction length 152Lb of each of the openings 152a that are provided in the diode region 14b and the boundary region Mall The plurality of openings 152a and 252a of the interlayer insulation film 52 can have a repeated pattern of common shapes across the whole region of the IGBT region 14a, the diode region 14b, and the boundary region 14ab. Alternatively, as shown in FIG. 15, the pitch length 30La of the plurality of first trench gates 30A in the y-axis direction may be longer than the pitch length 40L of the plurality of stripe dummy trenches 40A in the y-axis direction, and the pitch length 30Lb of the plurality of second trench gates 30B in the x-axis direction may he equal to the pitch length 40L of the plurality of stripe dummy trenches 40A in the y-axis direction. In this case, as shown in FIG. 16, the y-axis direction length 252La of each of the openings 252a that are provided in the IGBT region 14a is equal to the x-axis direction length 152Lb of each of the openings 152a that are provided in the diode region 14b and the boundary region 14ab, and the x-axis direction. length 252Lb of each of the openings 252a that are provided in the IGBT region 14a is equal to the y-axis direction length 152La of each of the openings 152a that are provided in the diode region 14b and the boundary region 14ab. In this case, too, the plurality of openings 152a and 252a of the interlayer insulation film 52 can have a repeated pattern of common shapes across the whole region of the IGBT region 14a, the diode region 14b, and the boundary region 14ab. Thus, the reverse conducting IGBT 3 shown in FIGS. 13 to 16 can achieve both improvement in the characteristics of the IGBT structure and flattening of the surface of the emitter electrode 38.

Figure 17:
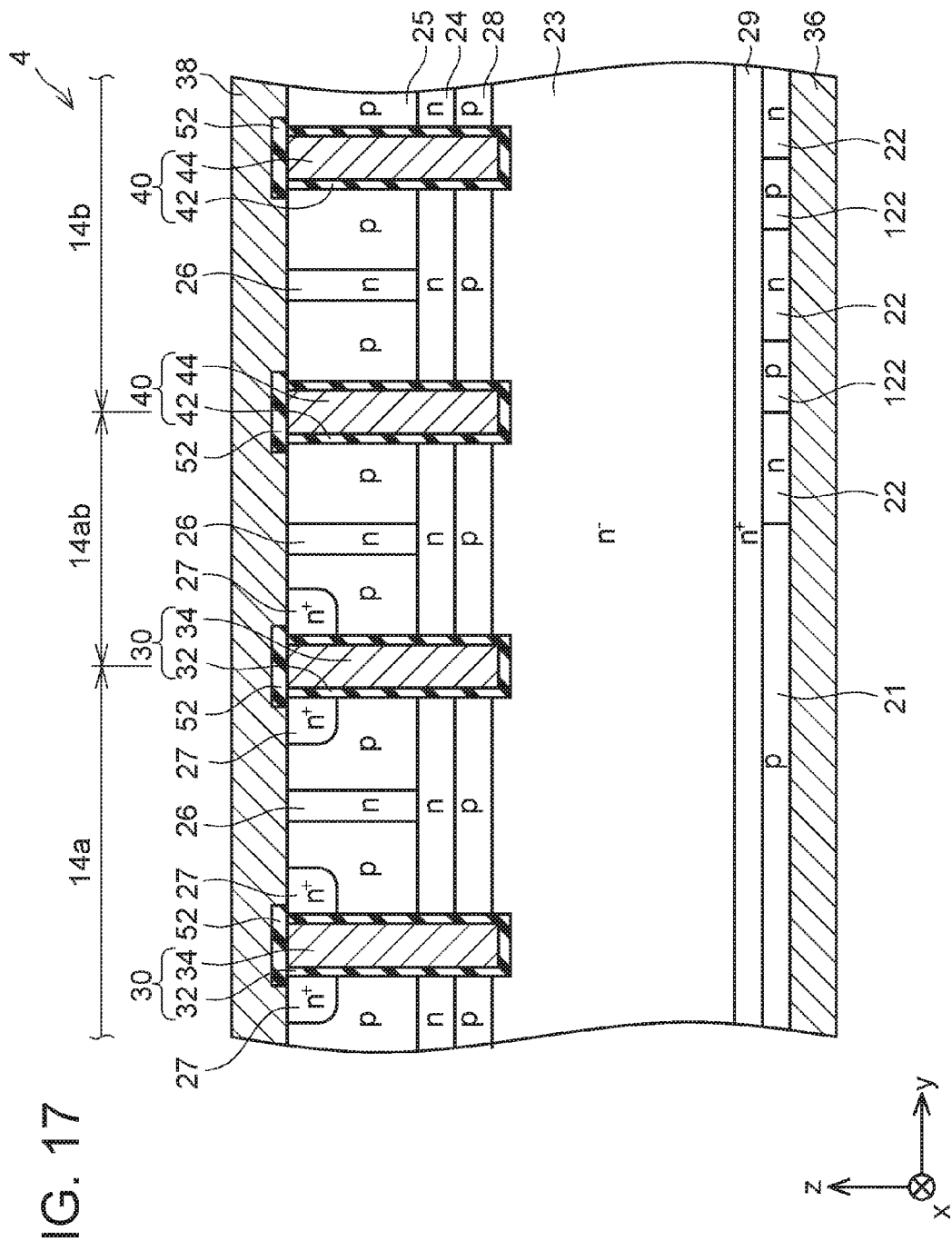
FIG. 17 is a cross-sectional view schematically showing main components in a boundary range between an IGBT region and a diode region of a reverse conducting IGBT according to a modification.

FIG. 17 shows a reverse conducting IGBT 4 according to a modification. The semiconductor substrate 10 of this reverse conducting IGBT 4 includes an n$^+$-type buffer region 29 and a p-type cathode short region 122.

The buffer region 29 is disposed in the IGBT regions 14a, the diode regions 14b, and the boundary regions 14ab. The buffer region 29 is provided between the drift region 23 and the collector region 21, between the drift region 23 and the cathode region 22, and between the drift region 23 and the cathode short region 122, and has an impurity concentration which is higher than an impurity concentration of the drift region 23. The buffer region 29 is formed, for example, by introducing phosphorus through the bottom surface of the semiconductor substrate 10 by utilizing the ion implantation technique. In one example, the buffer region 29 has a peak impurity concentration of $1 \times 10^{15}$ to $1 \times 10^{18}$ cm$^{-3}$ and a thickness of 0.2 to 5 µm.

The cathode short region 122 is disposed in the diode region 14b. The cathode short region 122 is provided in a part of the lower layer portion of the semiconductor substrate 10 and exposed at the bottom surface of the semiconductor substrate 10. The cathode short region 122 and the cathode region 22 are configured to be alternately arranged in a repeated pattern in a lower layer portion of the diode region 14b of the semiconductor substrate 10. The cathode short region 122 is in ohmic contact with the collector electrode 36.

Provision of such a cathode short region 122 causes a relative reduction in the area that is occupied by the cathode region 22 in the diode region 14b, thus reducing the number of electrons injected from the cathode region 22 toward the drift region when the diode structure conducts. This further improves the reverse recovery characteristics of the diode structure.

Some of the technical features disclosed in this specification are summarized below. Note that matters described below respectively independently have technical utility.

One aspect of a reverse conducting IGBT disclosed in this application may comprise a semiconductor substrate, a bottom surface electrode, a top surface electrode, a trench gate member and a trench member. The semiconductor substrate is partitioned into an IGBT region in which an IGBT structure is provided and a diode region in which a diode structure is provided. The semiconductor substrate may be further participated into other regions which are different from the IGBT region and the diode region, for example, a boundary region provided between the IGBT region and the diode region. The material of the semiconductor substrate is not particularly limited. The bottom surface electrode is in contact with a bottom surface of the semiconductor substrate, and is in contact with both the IGBT region and the diode region of the semiconductor substrate. The top surface electrode is in contact with a top surface of the semiconductor substrate, and is in contact with both the IGBT region and the diode region of the semiconductor substrate. The trench gate member is provided in the IGBT region of the semiconductor substrate, and has a lattice-pattern layout when seen from a direction orthogonal to the top surface of the semiconductor substrate. The lattice-pattern layout means that the trench gate member includes a plurality of ring-like portions, a shape of the ring-like portion is not particularly limited. The trench member is provided in the diode region of the semiconductor substrate, and has a stripe-pattern layout when seen from the direction orthogonal to the top surface of the semiconductor substrate. The trench member comprises a plurality of stripe trenches extending along a first direction. The diode region of the semiconductor substrate comprises an anode region of a first conductive type, a drift region of a second conductive type and a barrier region of the second conductive type. The anode region is provided between adjacent stripe trenches, is exposed at the top surface of the semiconductor substrate, and is in contact with the top surface electrode. The drift region is provided beneath the anode region. The barrier region is provided between adjacent stripe trenches, is provided between the anode region and the drift region, and has an impurity concentration which is higher than an impurity concentration of the drift region. The barrier region is electrically connected to the top surface electrode via a pillar member that extends from the top surface of the semiconductor substrate. A configuration of the pillar member is not particularly limited as long as providing electrical connection between the emitter electrode and the barrier region. For example, the pillar member can be configured to include a semiconductor region of a second conductive type, a conductor such as metal, or a combination thereof. It is preferable that the pillar member is in Schottky contact with the emitter electrode.

In the reverse conducting IGBT disclosed in the application, an exposed surface of the pillar member is exposed at the top surface of the semiconductor substrate and may extend along the first direction. In this case, a longitudinal direction of the exposed surface of the pillar member is in parallel to a longitudinal direction of the stripe trench. It is preferable that the exposed surface of the pillar member extends longer than a pitch length of the trench gate in the first direction. It is further preferable that the exposed surface of the pillar member extends an entire range of the diode region along the first direction. In this way, when the exposed surface of the pillar member extends along the first direction, an area of the exposed surface of the pillar member in one barrier region can be larger so that a favorable electrical connection between the pillar region and the emitter electrode can be realized.

In the reverse conducting IGBT disclosed in the application, exposed surfaces of the pillar member are exposed at the top surface of the semiconductor substrate, and may be dispersedly arranged along the first direction.

In this case, a dispersing direction of exposed surfaces of the pillar member is in parallel to a longitudinal direction of the stripe trench. It is preferable that an existing range where exposed surfaces of the dispersed pillar member exist is longer than a pitch length of the trench gate in the first direction. It is further preferable that exposed surfaces of the pillar member are dispersedly arranged in an entire range of the diode region along the first direction. In this way, when exposed surfaces of the pillar member are dispersedly arranged along the first direction, an area of the exposed surface of the pillar member in one barrier region can be larger so that a favorable electrical connection between the pillar region and the emitter electrode can be realized.

In the reverse conducting IGBT disclosed in the application, the trench gate member may comprise a plurality of first trench gates and a plurality of second trench gates. The plurality of first trench gates extends along the first direction. The plurality of second trench gates extends along a second direction orthogonal to the first direction between adjacent first trench gates. The trench gate member of this configuration can include a lattice-layout which is configured of a plurality of rectangular ring-like portions In the reverse conducting IGBT disclosed in the application, a pitch length of the plurality of first trench gates in the second direction may be longer than a pitch length of the plurality of stripe trenches in the second direction, and a pitch length of the plurality of second trench gates in the first direction may be longer than the pitch length of the plurally of stripe trenches in the second direction. in this case, a relaxation of an electric field concentration and a repression of a gate interference in the IGBT structure are realized.

In the reverse conducting IGBT disclosed in the application may further comprise an interlayer insulation film. The interlayer insulation film is provided between the top surface of the semiconductor substrate and the top surface electrode, wherein a plurality of openings is formed in the interlayer insulation film so that the top surface electrode is in contact with the top surface of the semiconductor substrate. The plurality of openings of the interlayer insulation film includes openings distributed so as to correspond to top surface portions of the semiconductor substrate that are each enclosed by the lattice-patterned trench gate member. And, the plurality of openings of the interlayer insulation film includes openings distributed in the first direction corresponding to a top surface portion of the semiconductor substrate between adjacent stripe trenches. The interlayer insulation film including such lattice-pattern layout can improve a flatness of a top surface of the top surface electrode compared with a stripe-pattern layout.

In the reverse conducting IGBT in which the interlayer insulation film has a lattice-pattern layout, a pitch. length of the plurality of first trench gates in the second direction may be equal to a pitch length of the plurality of stripe trenches in the second direction, and a pitch length of the plurality of second trench gates in the first direction may be equal to the pitch length of the plurality of stripe trenches in the second direction. In this case, the plurality of openings of the interlayer insulation film can have a repeated pattern of square shape across the whole range of the IGBT region and the diode region. Therefore, the interlayer insulation film including such layout can drastically improve a flatness of a surface of the top surface electrode.

In the reverse conducting IGBT in which the interlayer insulation film has a lattice-pattern layout, the plurality of first trench gates has a pitch length in the second direction, and the plurality of second trench gates has a pitch length in the first direction, wherein one of the pitch lengths may be equal to a pitch length of the plurality of stripe trenches in the second direction, and the other of the pitch lengths may be longer than the pitch length of the plurality of stripe trenches in the second direction. In this case, the pitch length of the trench gate member in the IGBT region is longer than the pitch length of the trench member in the diode region, and the plurality of openings of the interlayer insulation film can have a repeated pattern of common shape across the whole range of the IGBT region and the diode region. Therefore, the reverse conducting IGBT of this embodiment can achieve both improvement in the characteristics of the IGBT structure and flattening of a surface of the top surface electrode.

In the reverse conducting IGBT in which the interlayer insulation film has a lattice-pattern layout, the pitch length of the plurality of first trench gates in the second direction may be equal to the pitch length of the plurality of stripe trenches in the second direction, and the pitch length of the plurality of second trench gates in the first direction may be longer than the pitch length of the plurality of stripe trenches in the second direction. In this case, the pitch length of the trench gate member in the IGBT region is longer than the pitch length of the trench member in the diode region, and the plurality of openings of the interlayer insulation film can have a repeated pattern of common shape across the whole range of the IGBT region and the diode region. Therefore, the reverse conducting IGBT of this embodiment can achieve both improvement in the characteristics of the IGBT structure and flattening of a surface of the top surface electrode.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A reverse conducting IGBT comprising:
   a semiconductor substrate partitioned into an IGBT region in which an IGBT structure is provided and a diode region in which a diode structure is provided;
   a bottom surface electrode in contact with a bottom surface of the semiconductor substrate, the bottom surface electrode being in contact with both the IGBT region and the diode region of the semiconductor substrate;
   a top surface electrode in contact with a top surface of the semiconductor substrate, the top surface electrode being in contact with both the IGBT region and the diode region of the semiconductor substrate;
   a trench gate member provided in the IGBT region of the semiconductor substrate, having a lattice-pattern layout when seen from a direction orthogonal to the top surface of the semiconductor substrate; and
   a trench member provided in the diode region of the semiconductor substrate, having a stripe-pattern layout when seen from the direction orthogonal to the top surface of the semiconductor substrate,
   wherein the trench member comprises a plurality of stripe trenches extending along a first direction,
   the diode region of the semiconductor substrate comprises:
      an anode region of a first conductive type that is provided between adjacent stripe trenches, is exposed at the top surface of the semiconductor substrate, and is in contact with the top surface electrode;
      a drill region of a second conductive type that is provided beneath the anode region;
      a barrier region of the second conductive type that is provided between adjacent stripe trenches, is provided between the anode region and the drift region, has an impurity concentration which is higher than an impurity concentration of the drift region, and is electrically connected to the top surface electrode via a pillar member that extends from the top surface of the semiconductor substrate.

2. The reverse conducting IGBT according to claim 1, wherein
   an exposed surface of the pillar member is exposed at the top surface of the semiconductor substrate and extends along the first direction.

3. The reverse conducting IGBT according to claim 1, wherein
   exposed surfaces of the pillar member are exposed at the top surface of the semiconductor substrate, and are dispersedly arranged along the first direction.

4. The reverse conducting IGBT according to claim 1, wherein
   the trench gate member comprises:
      a plurality of first trench gates extending along the first direction; and
      a plurality of second trench gates extending along a second direction orthogonal to the first direction between adjacent first trench gates.

5. The reverse conducting IGBT according to claim 4, wherein
   a pitch length of the plurality of first trench gates in the second direction is longer than a pitch length of the plurality of stripe trenches in the second direction, and
   a pitch length of the plurality of second trench gates in the first direction is longer than the pitch length of the plurality of stripe trenches in the second direction.

6. The reverse conducting IGBT according to claim 1, further comprising:
   an interlayer insulation film provided between the top surface of the semiconductor substrate and the top surface electrode, Wherein a plurality of openings is formed in the interlayer insulation film so that the top surface electrode is in contact with the top surface of the semiconductor substrate,
   wherein the plurality of openings of the interlayer insulation film includes openings distributed so as to correspond to top surface portions of the semiconductor substrate that are each enclosed by the lattice-patterned trench gate member, and
   the plurality of openings of the interlayer insulation film includes openings distributed in the first direction corresponding to a top surface portion of the semiconductor substrate between adjacent stripe trenches.

7. The reverse conducting IGBT according claim 6, wherein
the trench gate member comprises:
a plurality of first trench gates extending along the first direction; and
a plurality of second trench gates extending along a second direction orthogonal to the first direction between adjacent first trench gates,
a pitch length of the plurality of first trench gates in the second direction is equal to a pitch length of the plurality of stripe trenches in the second direction, and
a pitch length of the plurality of second trench gates in the first direction is equal to the pitch length of the plurality of stripe trenches in the second direction.

8. The reverse conducting IGBT according to claim 6, wherein
the trench gate member comprises:
a plurality of first trench gates extending along the first direction; and
a plurality of second trench gates extending along a second direction orthogonal to the first direction between adjacent first trench gates,
the plurality of first trench gates has a pitch length, in the second direction, and the plurality of second trench gates has a. pitch length in the first direction, and
one of the pitch lengths is equal to a pitch length of the plurality of stripe trenches in the second direction, and the other of the pitch lengths is longer than the pitch length of the plurality of stripe trenches in the second direction.

9. The reverse conducting IGBT according to claim 8, wherein
the pitch length of the plurality of first trench gates in the second direction is equal to the pitch length of the plurality of stripe trenches in the second direction, and
the pitch length of the plurality of second trench gates in the first direction is longer than the pitch length of the plurality of stripe trenches in the second direction.

* * * * *

UNITED STATES PATENT AND TRADEMARK OFFICE
CERTIFICATE OF CORRECTION

PATENT NO. : 9,589,952 B2
APPLICATION NO. : 15/095458
DATED : March 7, 2017
INVENTOR(S) : Masaru Senoo It is certified that error appears in the above-identified patent and that said Letters Patent is hereby corrected as shown below:

In the Specification

At Column 01, Line 07, change from "Application No. 2015407314" to "Application No. 2015-107314"

At Column 01, Line 31, change from "between a type anode anode region" to "between a p-type anode region"

At Column 01, Line 42, change "the bather region" to "the barrier region"

At Column 02, Line 60, change "the bather region" to "the barrier region"

At Column 03, Line 10, change "the bather region" to "the barrier region"

At Column 03, Line 14, change "the bather region" to "the barrier region"

At Column 05, Line 06, change "AlSi (or AD/Ti/Ni/Au" to "AlSi (or Al) /Ti/Ni/Au"

At Column 06, Line 18, change "$1 \times 10^{18}$ and" to "$1 \times 10^{18}$ cm$^3$ and"

At Column 07, Line 17, change "the bather region" to "the barrier region"

At Column 08, Line 22, change "each french gate" to "each trench gate"

At Column 09, Line 38, change "at our corners" to "at four corners"

At Column 10, Line 56, change "the bather region" to "the barrier region"

At Column 11, Line 06, change "region 14B" to "region 14b"

Signed and Sealed this
Twenty-fourth Day of July, 2018

Andrei Iancu
*Director of the United States Patent and Trademark Office*

CERTIFICATE OF CORRECTION (continued)
U.S. Pat. No. 9,589,952 B2

At Column 13, Line 54, change "different front each other" to "different from each other"

At Column 13, Line 61, change "gate 3013 in the" to "gate 30B in the"

At Column 14, Line 03, change "region Mall the" to "region 14ab. The"

At Column 14, Line 12, change "may he equal" to "may be equal"

At Column 15, Line 65, change "one harrier region" to "one barrier region"

At Column 16, Line 33, change "the plurally of" to "the plurality of"

At Column 16, Line 34, change "direction. in" to "direction. In"

In the Claims

At Column 18, Line 15, change "a drill region" to "a drift region"

At Column 18, Line 55, change "electrode, Wherein" to "electrode, wherein"

At Column 19, Line 01, change "according claim 6" to "claim to claim 6"